United States Patent
Motoki et al.

(10) Patent No.: US 7,303,630 B2
(45) Date of Patent: Dec. 4, 2007

(54) METHOD OF GROWING GAN CRYSTAL, METHOD OF PRODUCING SINGLE CRYSTAL GAN SUBSTRATE, AND SINGLE CRYSTAL GAN SUBSTRATE

(75) Inventors: Kensaku Motoki, Hyogo (JP); Takuji Okahisa, Hyogo (JP); Ryu Hirota, Hyogo (JP); Seiji Nakahata, Hyogo (JP); Koji Uematsu, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 679 days.

(21) Appl. No.: 10/933,291

(22) Filed: Sep. 3, 2004

(65) Prior Publication Data

US 2005/0092234 A1    May 5, 2005

Related U.S. Application Data

(63) Continuation-in-part of application No. 10/700,495, filed on Nov. 5, 2003, now Pat. No. 7,112,826.

(51) Int. Cl.
*C30B 21/08* (2006.01)

(52) U.S. Cl. .................. 117/94; 117/95; 117/96; 117/101; 117/104; 257/101; 257/74; 257/75

(58) Field of Classification Search .............. 117/94, 117/95, 96, 104, 101; 257/103, 74, 75
See application file for complete search history.

(56) References Cited

U.S. PATENT DOCUMENTS 6,091,085 A * 7/2000 Lester .................. 257/98
6,537,839 B2   3/2003 Ota et al.
6,555,846 B1   4/2003 Watanabe et al.
6,815,728 B2 * 11/2004 Tsuda et al. .............. 257/98
6,841,274 B2 *  1/2005 Ueno et al. ............... 428/698
2003/0001168 A1 *  1/2003 Tsuda et al. .............. 257/103
2005/0095861 A1 *  5/2005 Ueno et al. ............... 438/689
2005/0179130 A1 *  8/2005 Tanaka et al. ............. 257/730

FOREIGN PATENT DOCUMENTS

| JP | 10-171276   | 6/1998 |
| JP | 10-9008     | 1/2000 |
| JP | 10-102546   | 4/2001 |
| WO | WO 99/23693 | 5/1999 |

* cited by examiner

*Primary Examiner*—Robert Kunemund
(74) *Attorney, Agent, or Firm*—McDermott Will & Emery LLP

(57) ABSTRACT

Dotted seeds are implanted in a regular pattern upon an undersubstrate. A GaN crystal is grown on the seed implanted undersubstrate by a facet growth method. The facet growth makes facet pits above the seeds. The facets assemble dislocations from neighboring regions, accumulate the dislocations into pit bottoms, and make closed defect accumulating regions (H) on the seeds. The polycrystalline or slanting orientation single crystal closed defect accumulating regions (H) induce microcracks due to thermal expansion anisotropy. The best one is orientation-inversion single crystal closed defect accumulating regions (H). At an early stage, orientation-inverse protrusions are induced on tall facets and unified with each other above the seeds. Orientation-inverse crystals growing on the unified protrusions become the orientation-inverse single crystal closed defect accumulating regions (H).

42 Claims, 11 Drawing Sheets

Fig.1  Prior Art
Decrement of dislocations by a pit made by facets
(a) a pit made by facets
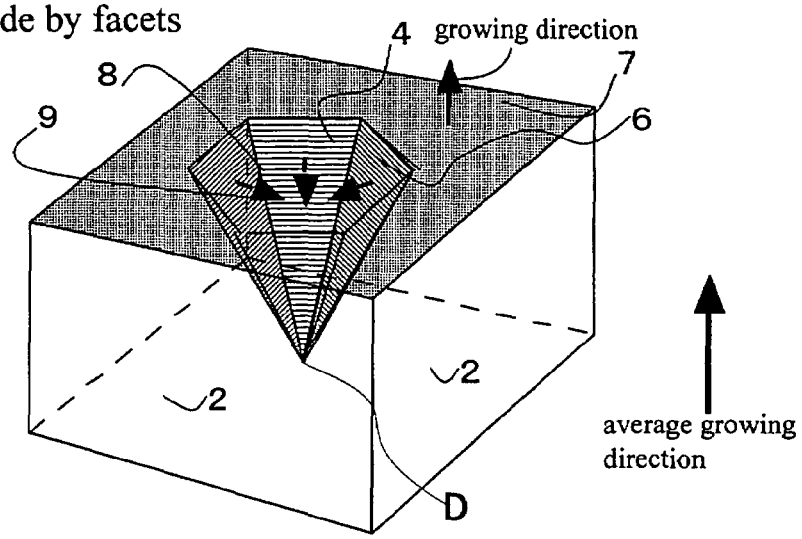
(b) after continual growth
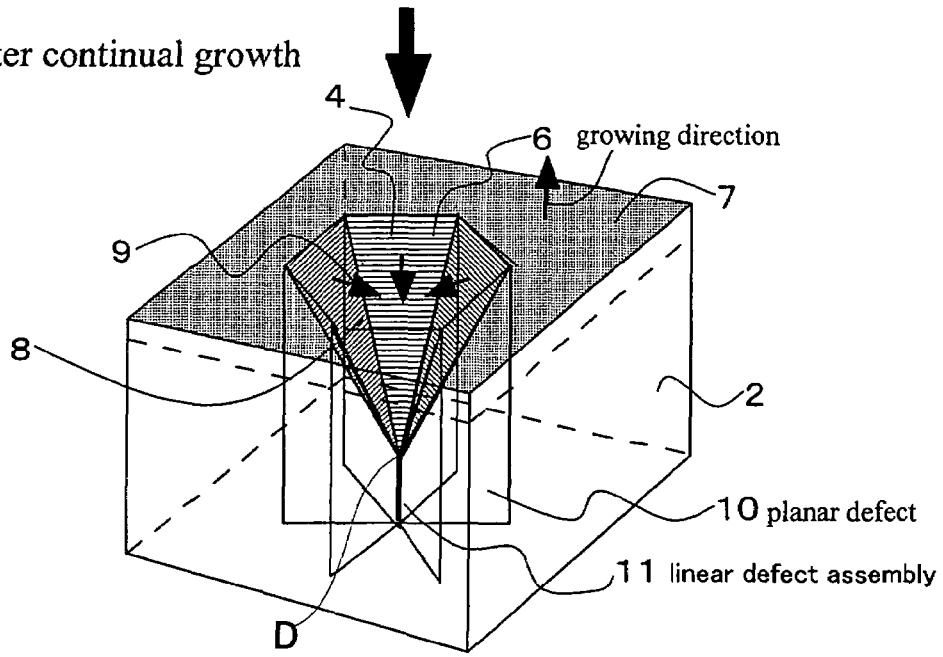

Movements of dislocations inside a pit made by facets

Fig.3  Prior Art
Facet growth
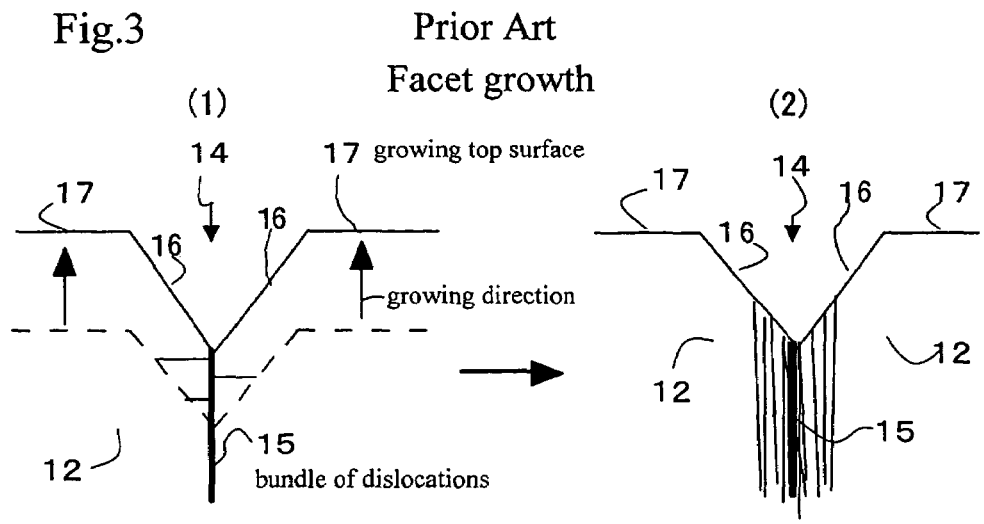
Fig.4  Growing method of the present invention
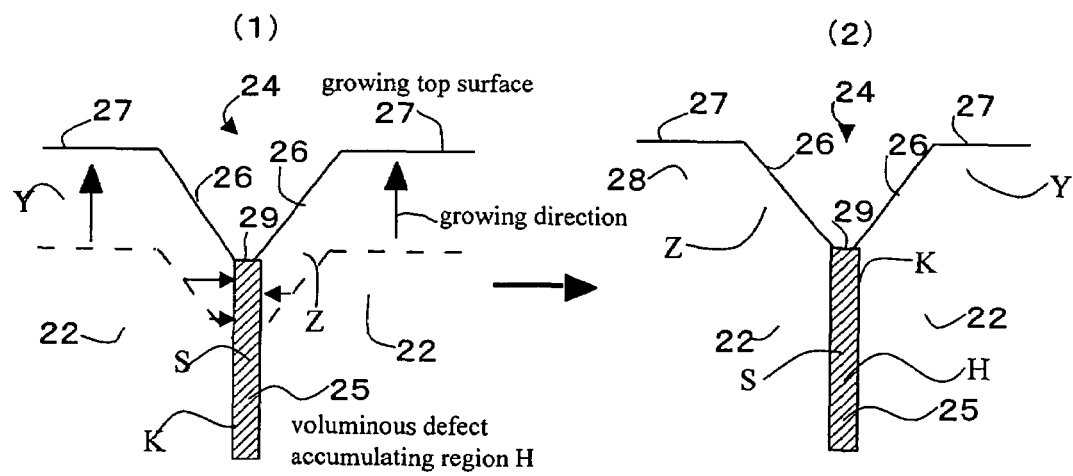

(Z) region

360nm/560nm ratio
of photoluminescence power

1750/90=19.4

Fig. 14
(1) ELO mask  PRIOR ART
(2) facet-seeds
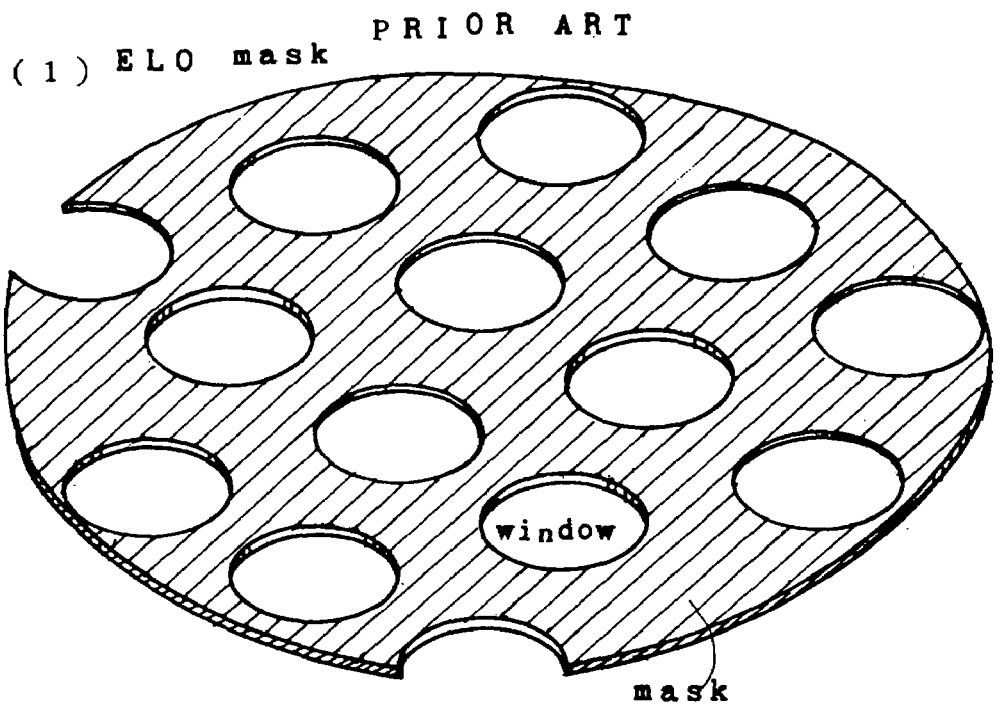
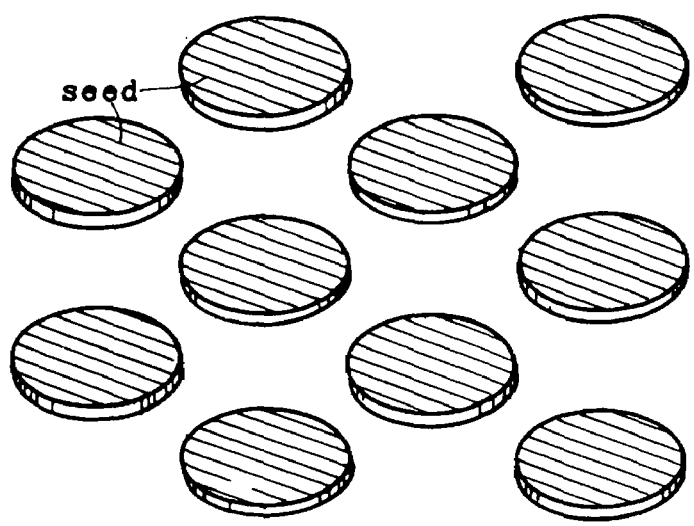

METHOD OF GROWING GAN CRYSTAL, METHOD OF PRODUCING SINGLE CRYSTAL GAN SUBSTRATE, AND SINGLE CRYSTAL GAN SUBSTRATE

CROSS REFERENCE TO RELATED APPLICATIONS

This application is a continuation-in-part of and claims priority to U.S. patent application Ser. No. 10/700,495, filed on Nov. 5, 2003, now U.S. Pat. No. 7,112,826 entitled "SINGLE CRYSTAL GaN SUBSTRATE, METHOD OF GROWING SAME AND METHOD OF PRODUCING SAME" by Kensaku MOTOKI et al.

BACKGROUND OF THE INVENTION

1. Field of the Invention

This invention relates to a single crystal gallium nitride (GaN) substrate for producing blue light emitting diodes (LEDs) and blue light laser diodes (LDs) composed of group 3-5 nitride type semiconductors, to a method of producing a single crystal gallium nitride substrate, and to a method of growing a GaN crystal.

Blue light emitting diodes (LEDs) based upon the group 3-5 nitride type semiconductors (InGaN, GaN) have been manufactured, sold and used on a large scale. Almost all the practical nitride type LEDs are made upon insulating sapphire ($\alpha$-Al$_2$O$_3$) substrates. Sapphire belongs to trigonal symmetry group (a=b=c, $\alpha$, $\beta$, $\gamma$<120, ≠90). GaN films and InGaN films are heteroepitaxially grown on a sapphire three rotationally symmetric plane for producing LEDs. On-sapphire LEDs made upon sapphire substrates have very high dislocation density of $10^9$ to $10^{10}$ cm$^{-2}$. Despite great many dislocations, on-sapphire LEDs do not degenerate and enjoy a long lifetime.

Sapphire has, however, some drawbacks as a substrate. Sapphire lacks natural cleavage. Sapphire is an insulator. Lack of natural cleavage incurs a problem of chip-division. A device-fabricated sapphire wafer is cut and separated into individual device chips by mechanical dicing. The mechanical dicing lowers the yield and enhances the cost.

2. Description of Related Art

The most suitable substrate for nitride type (InGaN) LDs and LEDs should be a GaN single crystal substrate which allows InGaN, GaN, AlGaN films to grow homoepitaxially.

Czochralski method and Bridgman method which change a melt polycrystal material into a melt, cool a part of the melt and make a large single crystal bulk solid at a thermal equilibrium, are unavailable for making a GaN single crystal.

A new method of making a thick GaN film on a foreign material substrate (e.g., sapphire) by vapor phase epitaxial growth method was proposed. It is an extension of a film growth method. However, a sapphire substrate which is chemically stable and physically rigid cannot be eliminated after the GaN film has been grown on the sapphire substrate. Thus, sapphire is not pertinent for the substrate for growing GaN films for the purpose of obtaining a freestanding GaN crystal. Recently trials have been done for eliminating sapphire substrates from grown GaN films by a laser. However, the separation of the sapphire substrates from the GaN films is difficult even by high power lasers.

Instead of the sapphire substrate, another candidate which can be eliminated from grown GaN films would be a GaAs substrate. A (111) plane of GaAs has three-fold rotation symmetry. A C-plane GaN film would be grown in vapor phase along c-axis on the (111) GaAs substrate. However, it is found that thick GaN is not grown upon a GaAs substrate. Perhaps differences of lattice constants and thermal expansions between GaAs and GaN cause the difficulty of growing thick GaN on the GaAs substrate. The lattice misfit and the thermal distortion induce large inner stress which forbids a GaN film from growing to a thick crystal. A breakthrough was required for making a thick GaN crystal in vapor phase.

The inventors of the present invention contrived a GaAs-based epitaxial lateral overgrowth method (ELO) for making low-dislocation GaN crystals by preparing a GaAs substrate, making an ELO mask having many small regularly-populated windows on the GaAs substrate, and growing GaN films by a vapor phase growing method on the ELO-masked GaAs substrate. The inventors had filed a series of patent applications based on the GaAs-based ELO methods for making GaN crystal bulks.

1. Japanese Patent Application No. 9-298300
2. Japanese Patent Application No. 10-9008
3. Japanese Patent Application No. 10-102546
 (1, 2 and 3 have been combined into a PCT application of WO 99/23693.)
4. Japanese Patent Application No. 10-171276
5. Japanese Patent Application No. 10-183446

An ELO mask is made by preparing a three-fold rotation symmetric GaAs (111) substrate, piling a thin SiN film (e.g., 100 nm thickness) on the GaAs substrate, and forming many small regularly-distributed striped or dotted windows on the SiN film by etching.

Then, epitaxial GaN films are grown on the non-masked GaAs substrate in vapor phase at a high temperature. The GaN films make normal cones on the windows. The GaN cones overrun the edges of the ELO mask, crawl on the mask and meet with other GaN films on the ELO mask on a bisector.

After two neighboring GaN films meet on the bisector, the growing direction changes. The GaN films grow in the vertical direction along an c-axis. It is a C-plane growth which maintains the C-plane as a unique, smooth, flat surface. The C-plane growth is a well known-method of GaN growth. A long-term vapor phase growth makes a thick GaN/mask/GaAs samples of several hundreds of thickness. Then, the mask and the GaAs substrate are eliminated by, for example, aqua regia.

The epitaxial lateral overgrowth (ELO) method which makes use of a mask having many windows can produce a GaN crystal of $1-2\times10^7$ cm$^{-2}$ dislocation density. Reduction of dislocations is insufficient. ELO-made GaN crystals are unsatisfactory as a GaN substrate upon which InGaN type LDs are fabricated. InGaN-LDs require better GaN crystals of far smaller dislocation density.

6. Japanese Patent Laying Open No. 2001-102307 (Japanese Patent Application No. 11-273882)

Facet growth was proposed in the document 6 by the same inventors as the present invention. All the known GaN growth has been C-plane growth which maintains a smooth, flat C-plane as a surface of c-axis growing GaN. The document 6 denied the conventional C-plane growth and advocated facet growth which makes facets and pits composed of the facets on a growing GaN surface and maintains the facets and pits without burying pits. A GaN facet grows in a direction normal to the facet. Although an average direction of growth is a c-axis direction, microscopic growing directions are non-c-axis directions.

FIG. 1 to FIG. 3 show our previous facet growth. In FIGS. 1(a) and (b), a GaN crystal 2 is growing in a c-axis direction, having a C-plane top surface 7. Crystallographical planes inclining to the C-plane are called facets 6. The facet growth forms facets and maintains the facets without burying facets. In the example of FIG. 1, six facets 6 appear and form a polygonal reverse cone pit 4 on the C-plane surface. The pits built by the facets are hexagonal cones or dodecagonal cones. Hexagonal pits are formed by six-fold rotation symmetric facets of either {11-2 m} or {1-10 m} (m: integer). Dodecagonal pits are composed of {11-2 m} and {1-10 m} (m: integer). Although FIGS. 1(a) and (b) show the hexagonal pit, dodecagonal pits appear prevalently.

To form facet pits, to maintain pits and not to bury pits are the gist of the facet growth. A facet 6 displaces at a direction normal to the facet. A dislocation extends along a growing direction. A dislocation extending along a c-axis and attaining the facet turns an extending direction in a horizontal direction parallel to the facet and reaches a crossing line 8. The crossing lines 8 include many dislocations. As the top surface moves upward, loci of the crossing lines 8 make crossing planes 6 which meet with each other at 60 degrees. Planar defect assemblies 10 are formed on the crossing planes. The planar defect assemblies 10 are a stable state.

Some dislocations attaining to the crossing line turn an extending direction again inward, move inward along the rising slanting crossing line 8 and fall into a manifold point D at a pit bottom. The dislocation substantially runs inward in the horizontal direction. A linear defect assembly 11 is formed along the manifold point D at the bottom of the pit. The linear defect assembly 11 is less stable than the planar defect assemblies 10.

The inventors noticed that the facet growth method has still problems for producing GaN wafers for making LD chips.

The facet growth can gather dislocations into a narrow volume by making facet pits, growing a GaN crystal without burying facets, gathering dislocations into the bottoms of pits. Dislocations do not necessarily converge to a single point but diffuse outward. When a plurality of 100 μmφ pits are formed, dislocations converge to a narrow spot at a bottom of a pit somewhere. But at other regions, dislocations diffuse till about 30 μmφ wide range. The 30 μmφ diffusion makes a hazy dislocation nebula.

This means that once converged dislocations disperse again to a hazy nebula of dislocation. It was confirmed that lines of the hazy nebulae diffusing from the pit bottom assembly include many dislocations.

Hazy dislocation nebulae have very high dislocation density of $10^7$ cm$^{-2}$ which is ten times as much as an average dislocation density ($10^6$ cm$^{-2}$). Such high dislocation density $10^7$ cm$^{-2}$ of the hazy dislocation nebulae is insufficient for making use of the GaN crystal as an LD substrate for making LD devices. An LD substrate requires low dislocation density less than $10^6$ cm$^{-2}$. The occurrence of the hazy dislocation nebulae is the first problem of the previous facet growth.

The second problem is planar defect assemblies which are born by gathering dislocations to the pit bottoms and inclining to each other at 60 degrees. The planar defect assemblies dangle from the crossing lines 8. 60 degrees spacing planar defect assemblies 10 have six-fold rotation symmetry. The planar defect assemblies include high density dislocations. In addition to the hazy dislocation nebulae, the radially extending planar defects assemblies are a serious problem for an LD substrate, since the planar defects would induce degeneration and would restrict lifetime of LDs. An LD substrate requires a reduction of the planar defect assemblies.

The last problem is more fundamental. Occurrence and distribution of pits are stochastic, accidental and unprogrammable. The distribution of pits are entirely at random. The previous facet growth method which reduces dislocations by growing facet pits without burying, has a weak point of undeterminable positions of pits. It is impossible to previously determine or know the spots at which facet pits happen. An accident makes a pit at an undetermined spot. The positions of pits are stochastic variables. The formation of pits are uncontrollable. Uncontrollability of pit positions is a serious problem.

Three matters aforementioned are the problems to be solved by the present invention. In short, the objects of the present invention are converged into three matters;

(1) Reduction of hazy diffusion of dislocations from the defect assemblies of the centers of facet pits (FIG. 3(2)).

(2) Annihilation of planar defects occurring at the centers of the facet pits (FIG. 1(b)).

(3) Controlling of positions of defect assemblies at the centers of facet pits.

All the three are difficult problems. Difficulties are again clarified here. The serious problem of the previous facet growth of the inventors which maintains facets and pits without burying the facets was an unstable state of defect assemblies at pit bottoms. FIGS. 3(1) and (2) show the state of defect assemblies of our previous facet growth method. Accidentally a pit 14 with facets 16 occurs somewhere on a growing GaN film surface. The positions of the pits cannot be determined previously. Occurrence of pits and points of occurrence of pits fully depended on contingency. Occurrence of pits and positions of pits were uncontrollable. In accordance with the GaN growth in an upward direction, facets 16 rise and dislocations move in the horizontal direction to the center of the pit 14. A dislocation bundle 15 is formed at the bottom of the pit 14. As shown in FIG. 3(2), the dislocation bundle is neither encapsulated nor arrested by anything. Ephemerally assembling, individual dislocations in the dislocation bundle have a strong tendency of diffusing and dispersing outward again by mutually acting repulsive force.

The present invention intentionally produces crystal boundaries and makes the best use of the boundaries for manufacturing low dislocation density GaN single crystals. FIG. 4 shows the action of the facets, pits and grain boundary of reducing dislocations. A growing GaN crystal 22 has a pit 24 consisting of facets 26. The facet pit 24 is not buried but maintained during the GaN growth. Top of the crystal is a C-plane surface 27. The facet pit 24 has a central bottom 29. When the GaN film further grows, facets 26 grow in the direction vertical to the facets 26. Dislocations are swept in the centripetal, horizontal directions to the pit center. The directions of dislocations are parallel to the C-plane 27. The dislocations attracted to the center are affiliated to dislocation assembly 25 at the pit bottoms 29. The dislocation assembly 25 is encapsulated by boundaries (K) 30. The dislocation assembly is called a "closed defect accumulating region (H)", since the region arrests, accumulates and is closed by the boundary (K). The closed defect accumulating regions (H) 25 have a very significant function of attracting, absorbing, annihilating and accumulating dislocations permanently.

Once dislocations are arrested, the dislocations cannot escape from the closed defect accumulating regions (H). Thus, the region (H) is "closed". The region (H) is closed by the grain boundary (K).

This invention preliminarily forms seeds on an undersubstrate, makes closed defect accumulating regions (H) following the seeds, and proceeds facet growth. The facet growth sweeps dislocations of the other regions and stores the swept dislocations into the closed defect accumulating regions (H). The closed defect accumulating regions (H) hold many dislocations captive. The seed-defined closed defect accumulating regions (H) and the facet growth enable us to accomplish all the aforementioned three purposes, (1) a decrease of foggy dislocations leaking from the centers of the facet pits, (2) an elimination of planar defect assemblies at the centers of the facet pits, and (3) a control of the positions of the defect assemblies at the centers of the facet pits.

However, some problems remain. The closed defect accumulating regions (H) take various crystal structures. Sometimes the closed defect accumulating regions (H) are polycrystal. Polycrystalline closed defect accumulating regions (H) have a tendency of diminishing and extinguishing midway. If the polycrystalline closed defect accumulating regions (H) survive, the polycrystalline closed defect accumulating regions (H) induce microcracks at the boundaries (K). The microcracks are caused by random differences of thermal expansion in the polycrystal, while the other parts are a single crystal. Microcracks break GaN substrates in wafer processes. Thus, the polycrystalline closed defect accumulating region (H) is not best.

A single crystal closed defect accumulating region (H) with slanting axes or slantingly inverse axes also incurs microcracks at the interfaces. The reason why the microcracks occur is also the thermal expansion anisotropy different from the other (0001) single crystal parts. Polycrystalline or slanting oriented single crystal closed defect accumulating regions (H) are not the best ones owing to the microcracks caused by the thermal expansion discrepancy between the (H) regions and the other regions.

A single crystal closed defect accumulating region (H) with exact inverse axes (precise 180 degree rotating, antiparallel to the other parts) incurs no microcracks at the interfaces. It is because the thermal expansion anisotropy in the closed defect accumulating region (H) exactly coincides with anisotropy of the other parts, since the orientations are exactly inverse. Due to no probability of the microcracks, the orientation-inverse single crystal one is the best closed defect accumulating region (H).

However, properties and orientations of closed defect accumulating regions (H) depend upon accidents. It is difficult to always form orientation-inverse, antiparallel single crystal closed defect accumulating regions (H) even on dot-seeded undersubstrates.

For example, in the case of forming an $SiO_2$ seed mask on a sapphire undersubstrate, sometimes polycrystalline closed defect accumulating regions (H) happen on the seed. Other times slanting-orientation single crystal closed defect accumulating regions (H) grow on the seed. Once formed slanting-orientation closed defect accumulating regions (H) often disappear halfway. Sometimes closed defect accumulating regions (H) of orientation-inverse single crystals mixed with polycrystals are born on the dotted seeds.

The conditions of making desired orientation-inverse (antiparallel) closed defect accumulating regions (H) on the dot seed have not been known yet.

The inventors have thoroughly investigated the cases in which orientation-inverse closed defect accumulating regions (H) have been formed on the seeds. The inventors sought for a way how to build the orientation-inverse single crystal closed defect accumulating regions (H) on the dotted seeds with high probability and found the way of forming the orientation-inverse (H) region. Then, the fourth purpose is, (4) formation of orientation-inverse single crystal closed defect accumulating regions (H) with high probability.

SUMMARY OF THE INVENTION

The inventors have examined GaN crystal growth, growth conditions, and processes of growth by optical microscopes, scanning electron microscopes (SEM), transmission electron microscopes (TEM), cathode luminescence, etching anisotropy, fluorescence microscopes, high energy electron diffraction, convergent beam electron diffraction and so on.

Vigorous investigation clarified the following conditions for making the antiparallel (orientation-inverse) single crystal closed defect accumulating regions (H) on seeds;

(1) The seed mask should be made of a material which strongly inhibits GaN crystals from growing thereupon.

(2) Edges of the seeds can forcibly resist horizontal invasion of GaN crystal growth and can inhibit GaN crystals from overstepping the seeds for a long time. A thick GaN crystal blanket on a non-seed undersubstrate builds tall conical pit walls which are in contact with the edges of seeds at the bottom. The tall conical pit walls are $\{11\text{-}22\}$ facets in most cases. Conditions (1) and (2) invite a new phenomenon.

(3) A plurality of fine protrusions of inverse-orientation single crystals appear overall on the tall conical pit wall facets, grow in the pits and expand centripetally from the facets. If the pit wall were short, there would be no room for admitting protrusions to happen. Thus, the GaN crystal grows only on a non-seeded undersubstrate till the GaN blanket becomes thick sufficiently.

(4) The orientation-inverse single crystal protrusions increase in number, grow in size and extend centripetally toward facing, pairing protrusions over the seeds without touching the seeds.

(5) Upper surfaces of the orientation-inverse protrusions, which incline at 25 degrees to 35 degrees to a horizontal plane, are low angle $\{11\text{-}2\text{-}6\}$, $\{11\text{-}2\text{-}5\}$, $\{1\text{-}10\text{-}3\}$ or $\{1\text{-}10\text{-}4\}$ facets, in general, $\{11\text{-}2\text{-}m\}(m \geq 3)$ and $\{1\text{-}10\text{-}n\}(n \geq 2)$ facets. Here, the reason why the fourth Miller indices of the upper planes are negative despite upper planes is that the protrusion has an inverse-orientation in which the C-axis is directed downward. Attention should be paid to that all the axes for the protrusions are reverse to the blanket axes. Lower surfaces of the protrusions, which incline at 55 degrees to 65 degrees to a horizontal plane, are $\{1\text{-}122\}$ facets which are the same as the facing facets. The lower surfaces are not in contact with the seed.

(6) A plurality of protrusions centripetally extending from conical facets meet, couple and unify themselves with each other. Unification of the protrusions forms shallower cones having lower-angled $\{11\text{-}2\text{-}6\}$ or $\{11\text{-}2\text{-}5\}$ facets following steeper $\{11\text{-}22\}$ facets inherent in the pits.

(7) Unification of centripetally gathering protrusions produces grain boundaries (K') above the centers of the seeds in the inverse-orientation crystals. The center grain boundaries (K') in the inverse-orientation regions are lattice misfit planes. Inverse-orientation single crystals grow further thicker on the shallower facet cones ($\{11\text{-}2\text{-}6\}$ or $\{11\text{-}2\text{-}5\}$) above the seeds, so long as the fundamental $\{11\text{-}22\}$ facets are maintained in the pits of the GaN blanket around the seeded parts. The lattice misfit planes also grow upward without disappearing.

(8) Dislocations born in the non-seeded parts are swept away by the growing facets, and assembled into the on-seed shallow cones. The swept dislocations are partially annihilated and accumulated at the grain boundaries (K) around the closed defect accumulating regions (H) and at another grain boundaries (K') of the lattice misfit planes in the closed defect accumulating regions (H). So, the dislocations are remarkably reduced in normal-oriented regions except (H). The regions accumulating the dislocations (H, K, K') can be predetermined and the low dislocation regions (Z, Y) can be also predetermined.

The inventors confirmed that closed defect accumulating regions (H) satisfying the conditions (1) to (8) are all orientation-inversion single crystals. Orientation-inversion (antiparallel) single crystals are not abruptly produced at seed edges. Antiparallel single crystals are generated halfway as protrusions on slanting conical side facets of the pits. The protrusions are grown centripetally inward over the mask seed unlike other parts. Tips of the reversed-single crystals are unified and coupled with other protrusions in the same pit. The phenomenon of appearance of the orientation-inversion protrusions on tall facets is quite novel.

At an early stage, GaN crystals are grown only on non-seeded parts of the undersubstrate. The mask seeds inhibit GaN from growing thereupon. Edges of the seeds strongly prohibit the on-non-seed grown GaN crystal blanket from overrunning thereupon. Round seeds make reverse-conical pits with slanting facets. The slanting facets are also important. The slanting facets, whose feet are sturdily maintained by the seed edges, inhibits GaN crystals from overstepping the seeds. The facets are {11-22} planes in most cases. The inventors noticed that plenty of fine GaN polycrystalline grains are isolatedly dispersed upon the surfaces of the seeds, while the facets can prevent the GaN blanket from overstepping thereon.

At present, the reason why the orientation-inverse protrusions originate from the facets in the pits is not clear. The existence of the sparsely populated fine polycrystalline grains on the seed contributes to maintaining protrusions out of contact to the seeds. The polycrystalline grains perhaps prohibit the GaN crystal blanket from overstepping the seed under an extra condition of supersaturation of concentration of material gases.

The phenomenon is quite novel. The phenomenon of appearance of protrusions is clearly different from the well-known epitaxial lateral overgrowth (ELO). The difference between the ELO mask and the present invention facet-seed mask is that the ELO mask has a wider continual masked part and narrower dotted, separated, naked parts (windows) but the facet-seed mask has a wider continual naked part and narrower dotted, separated seeds. Dots are a naked undersubstrate in the ELO but covered with the seeds in the present invention. A wider continual part other than the dots is a mask in the ELO but dots are a mask in the present invention. Namely, the ELO mask is a continual unified mask like a stencil. But, the facet-seed mask of the present invention is an assembly of isolated seeds. FIG. 14 shows the difference between the ELO mask and the (present invention) facet-seed mask. The rate of naked parts is less than 30% in ELO masks but more than 70% in our facet-seed mask. The ELO produces many small, isolated GaN films with an under 30% area, but the facet-seed of the present invention produces a unified GaN blanket with an over 70% area at an early stage.

Another more important difference between the ELO and the present invention lies at a significant point whether the orientation is reversed or not reversed at the interfaces (mask edges) between the seeded parts and the non-seed parts.

The ELO allows GaN crystals to overstep the mask and to make crystals of the same orientation on the mask. Namely, ELO's crystals overleap the edges and extend on the mask, maintaining the same orientation. The expanded crystals are in contact with the ELO-mask. The crystals overrunning on an ELO mask have the same orientation as the GaN crystals grown on the non-masked parts in ELO. No orientation-inversion occurs in the epitaxial lateral overgrowth (ELO) at all.

On the contrary, the orientation inversion occurs in the facet-seeded present invention. The present invention assigns orientation-inversion to the crystals overstepping on the seeds by enlarging the protrusions which are inherently orientation-reversed. The existence of fine polycrystalline GaN particles not only prevents GaN crystals from invading on the seed but also plays an important role of reversing orientations on the seeds.

Low temperature buffer layer growth at an early stage is effective to prepare the fine GaN polycrystalline grains on the seeds. Low-temperature made buffer layer is composed of fine isolated polycrystalline particles.

In a hexagonal pit case, invasion barrier facets are mainly {11-22} facets. Dodecagon pits have mainly invasion barriers of {11-12} and {1-101} facets.

The facet-seed growth of the present invention is clarified by FIG. 5. FIG. 5(1) denotes a part of a dotted seed 63 deposited upon an undersubstrate 61. There are many seeds implanted on the undersubstrate, but only one seed is shown in the figures. Similar matters happen on other seeds. Here, we use "mask" or "mask seed" as a synonym of "seed". Unlike the (stencil) ELO mask, a mask is composed of many isolated seeds.

The undersubstrate 61 is a single crystal wafer of GaAs (111), for example. But, other materials, $Al_2O_3$(sapphire), Si, SiC, MgO, ZnO, GaAs, InP, GaP, GaN, AlN are available for the undersubstrate. The dotted mask seeds 63 have a function of inhibiting GaN from growing thereon. Two dimensionally, regularly repeated isolated dotted (mask) seeds 63 are formed on the undersubstrate 61 by evaporation, CVD, sputtering and photolithography. GaN fine nuclei are grown in vapor phase by, e.g., HVPE on the mask-seeded undersubstrate at a low temperature below 700° C., for example, at 450° C.-650° C. Since low temperature growth allows plenty of fine GaN nuclei 70 to cover the dotted seeds 63 as well as non-seeded parts 69 of the undersubstrate 61.

Then, GaN is grown in vapor phase at a high temperature more than 900° C., for example, at 1050° C. Such a high temperature prohibits GaAs nuclei to adhere to the dotted mask seeds 63. GaN granules adhere only to the non-seeded parts 69 of the undersubstrate 61. The non-seeded parts 69 are covered with GaN continual layers 64. Tops of the dotted seeds 63 are left uncovered. The seeds make reverse conical pits. The GaN layers 64 become a continual blanket laid on the non-mask seeded parts 69 with reverse cone pits 65. The GaN continual blanket has a high continual plateau 67 and many pits having hexagon or dodecagon conical slanting superficial facets 66 and 66. The surface of the GaN blanket has a (0001) orientation having a C-plane as a top surface.

The facets 66 are some low Miller index planes. In the case of hexagonal pits, the facets 65 are six {11-22} planes, more in detail, (2-1-12), (11-22), (-12-12), (-2112), (-1-122) (1-212). In the case of dodecagonal pits 65, the facets are twelve {11-22} planes and twelve {1-101} planes, more in detail, (2-1-12), (11-22), (-12-12), (-2112), (-1-122)

(1-212), (1-101), (0-111), (–1011), (–1101), (01-11), (10-11). The seeds 63 are still exposed at the bottoms of pits 65.

The pitted GaN blanket 64 and vacant seeds 63 are maintained till an enough thickness. FIG. 5(2) shows a part of the fat GaN blanket 64 and inverse-conical vacant spaces on the mask-seeds 63. High stability of {11-22} and {1-101} facets protects the slanting walls not to landslide.

Abruptly many triangle-sectioned protrusions 68 appear on the slanting facets 66 on sides of the pits 65 as shown in FIG. 5(3). As we will mention this later, the protrusions turn out to be single crystals having (000-1) orientation inverse to the other blanket (0001) crystal. The C-axis of the protrusions faces downward. Then, all Miller indices of the protrusions are inverse to the blanket (FIG. 13). A blanket (khmn) plane is entirely equal to a protrusion (-k-h-m-n) plane. Be careful not to confuse Miller indices for the (0001) blanket with Miller indices of (000-1) protrusions.

Milder slanting tops of the protrusions 68 have {11-2-m} (m≧3) planes in the case of hexagon pits. Milder slanting tops of the protrusions 68 have {11-2-m}(m≧3) planes and {1-10-n}(n≧2) in the case of dodecagon pits. Since the protrusions have a downward directing C-axis, upward surfaces have negative fourth Miller indices and downward surfaces have positive Miller indices.

Bottoms of the protrusions 68 are not in contact with the mask seed 63 but are separated from the mask-seed 63. Many fine random GaN granules 70 on the mask-seed 63 may prevent the protrusions 68 from touching the seed 63. This is important. The bottoms of the protrusions 68 have reverse indexes {11-22} which are equal to the Miller indices of the counterpart facing facets {11-22} in hexagonal pits. In addition, the bottoms of the protrusions 68 have reverse indexes {1-101} which are equal to the Miller indices of the counterpart facets {1-101} in dodecagon pits.

In FIG. 5(3), A means a left facet, B is a top of the left protrusion, C is a bottom of the left protrusion, D is a right facet, E and F are a top and bottom of the right protrusion. We discovered an important rule of C=D and F=A. In an ideal example of a hexagon pit,

| (hexagon pit case) | A (11-22) |
|---|---|
| | B (-1-12-5) |
| | C (-1-122) |
| | D (-1-122) |
| | E (11-2-5) |
| | F (11-22). |

In an ideal example of a dodecagon pit, in addition to the above relations,

| (dodecagon pit case) | A' (10-11) |
|---|---|
| | B' (-101-3) |
| | C' (-1011) |
| | D' (-1011) |
| | E' (10-1-3) |
| | F' (10-11). |

In any cases, the protrusions have shallower slopes than the blanket side facets {11-22} or {10-11}.

The inventors discovered that protrusions have a reverse-orientation (000-1). The GaN blanket on the non-masked parts have a normal orientation (0001). What is important is that the protrusions invert the orientation. Facing pairs of reverse-oriented protrusions expand and bridge over the mask seeds 63 without touching the seeds 63 in the progress of the growth in vapor phase.

Existence of random fine GaN particles 70 on the mask allows the protrusions to maintain the reverse orientation and bridge over the seeds 63, as shown in FIG. 5(4). Tips of the pairing protrusions 68 and 68 come into contact with each other. As shown in FIG. 5(5), lattice misfit spots (grain boundaries (K')) are born at the unified protrusions.

Since pairing facets A and D and pairing protrusions 68 and 68 are not always equivalent, junctions (K') of the pairing protrusions are not always just on the center of the mask-seed. Heights of the tips are not always equal. The junctions fluctuate right or left from the centers of the mask-seeds. The lattice misfit spots make fluctuating lattice misfit lines by the upward growth.

As shown in FIG. 5(5), vacant spaces beneath the junction above the seed 63 are filled with GaN granules 72. The filling GaN granules 72 grow downward from the bottom C and F planes of the protrusions. The filling GaN granules take the reverse-orientation since the C and F act as seed crystals. Vacant space above the junction is also filled with GaN granules 65 and 65. The GaN granules 65, which grow on the shallower B and E planes, take the reverse-orientation, since the B and E play a role of a seed. Facet growth of GaN continues without burying the facets. Thus, reverse-oriented GaN grows on the B and E planes. GaN crystals growing on the seed 63 become closed defect accumulating regions (H). GaN crystals growing on the facets 66 become low dislocation single crystal regions (Z), which are otherwise called facet regions. GaN crystals grown on the flat plateau (top) 67 of the GaN blanket become an extra low dislocation single crystal region (Y). The extra low dislocation region (Y) grow with a C-plane on top. Succeeding epitaxial growth sweeps dislocations out of the facet region (Z) and the C-plane region (Y) into the closed defect accumulating region (H). The appearance of the paring protrusions 68 and 68 from the facets 66 confirms the formation of the "reverse-oriented" closed defect accumulating region (H) on the seeds 63. Reverse-oriented single crystalline closed defect accumulating regions (H) are the most reliable, the most endurable, and the most powerful mechanisms for accumulating dislocations. The GaN facet growth proceeds till the blanket attains to a desired thickness.

GaN/undersubstrate wafers are produced. The undersubstrates are eliminated by etching or polishing. Freestanding GaN single crystal substrates are made.

The GaN substrates are not homogeneous but inhomogeneous. The GaN substrates are composed of three different regions H, Z and Y. The dotted closed defect accumulating regions (H) are populated regularly on the wafer.

The present invention proposes a method of growing a GaN crystal comprising the steps of:

preparing an undersubstrate;

forming a dotted mask pattern made of a material inhibiting GaN from growing partially on the undersubstrate;

providing the undersubstrate with a seed mask with a plurality of regularly aligning isolated, dotted seeds made of a material inhibiting GaN from growing;

forming seeded parts which are parts of the undersubstrate covered with the seed mask and a non-seeded part which is a part of the undersubstrate not covered with the seed mask;

epitaxially growing the GaN crystal on the non-seeded part of the undersubstrate but not growing the GaN crystal on the seeded parts of the undersubstrate at the beginning of GaN growth;

forming a plurality of reverse-conical pits having facets slantingly extending from edges of the seeded parts to the non-seeded part;

forming protrusions of GaN crystals which have reversed orientation different from that of the GaN crystal on the non-seeded part by 180 degrees and project slantingly from the slanting facets;

extending the protrusions so as not to touch the seeds;

unifying the protrusions near the upper middle of the seeded parts;

covering the whole seeded parts with the protrusions;

increasing a thickness of the GaN crystal on the non-seeded part with growing of the protrusions above the seeded parts;

increasing a thickness of the GaN crystal as a whole; and obtaining the GaN crystal having the reverse-oriented regions regularly aligned, wherein reverse-oriented regions different in orientation from the non-seeded part are formed exclusively on the seeded parts (claim 1).

The present invention also proposes an improved method in which a thin GaN buffer layer is preliminarily formed. The thickness of the GaN buffer layer is 0.5 µm to 3 µm. The pre-coating of the GaN thin film is effective for non-GaN substrates, for example, sapphire substrates. Then, a seed mask made of a material inhibiting epitaxial growth is coated on the undersubstrate coated with the GaN buffer layer. The starting wafer has a structure of seed/GaN/undersubstrate.

Freestanding GaN substrates obtained by eliminating the undersubstrate by etching or polishing are further polished for making mirror wafers. The top surface of the low dislocation density regions (Z & Y) are Ga-planes and the top surface of the closed defect accumulating regions (H) are N-planes.

During the epitaxial growth, top surfaces of the growing extra low dislocation single crystal regions (Y) are (0001) planes. Top surfaces of the growing accompanying low dislocation single crystal regions (Z) are steeper cones of 55 to 65 degrees composed of {11-22} facets or {1-101} facets. Top surfaces of the growing closed defect accumulating regions (H) are shallower cones of 25 to 35 degrees composed of {11-2-m} (m≧3) or {1-10-n}(n≧2) facets.

The reason why the protrusions originate from slanting pit facets is that the early low temperature growth makes many fine GaN polycrystalline granules on the mask and the polycrystalline granules inhibit GaN crystals from overstepping the seed and induce tall, high facets to make protrusions.

Centripetally extending protrusions meet, touch, couple and unify with each other above the centers of the seeds. Unification of the protrusions yields grain boundaries with lattice misfit above centers of the seeds. The grain boundaries begin to expand upward by further growth, forming a continual line. The grain boundaries fluctuate right or left above the seeds, depending upon growth conditions. Sometimes the grain boundaries deviate from the seed center lines and coincide with edges of the seeds. In this case, it is difficult to find out the grain boundaries in the orientation-inverse regions (H). However, the boundaries again fluctuate in reverse-directions. Extensions of once-vanished boundaries are found at other parts. The center grain boundaries are finally buried in the reverse-oriented closed defect accumulating regions (H) on the seeds.

The grain boundaries are lattice misfit lines in most cases. The unification induces lattice misfit between the centripetally extending protrusions at the seed centers. The misfit points extend into a misfit curving. line by further crystal growth. But, the misfit via the boundaries is not large. Sometimes no misfit occurs. Difference of the orientations via the lattice misfit is more than 0.1 degree but less than 5 degrees.

The facet-growth sweeps dislocations out of the facetted regions (Z) or the C-plane regions (Y), gathers them into interfaces (K) between H and Z, utilizes the interfaces (K) as dislocation accommodation places, and lowers the dislocation density of the Z and Y regions. A part of the gathered dislocations is annihilated in the interfaces (K) between H and Z. The other part of the gathered dislocations is stored in the interfaces (K). The interfaces (K) and the lattice misfit planes (K') have higher dislocation density than other parts of the closed defect accumulating regions (H).

The boundaries (K) which accommodate the gathered dislocations have high dislocation density from $10^6$ cm$^{-2}$ to $10^9$ cm$^{-2}$.

The lattice misfitting planes (K') in the closed defect accumulating regions (H) have high dislocation density from $10^6$ cm$^{-2}$ to $10^9$ cm$^{-2}$.

The undersubstrate should be any one of a sapphire ($Al_2O_3$) single crystal, a silicon (Si) single crystal, a silicon carbide (SiC) single crystal, a magnesium oxide (MgO) single crystal, a zinc oxide (ZnO) single crystal, a gallium arsenide (GaAs) single crystal, an indium phosphide (InP) single crystal, a gallium phosphide (GaP) single crystal, a gallium nitride (GaN) single crystal and an aluminum nitride (AlN) single crystal.

The single crystal undersubstrate should have a suitable surface with the same symmetry as GaN crystals. The undersubstrate is sometimes used without precoating. The undersubstrate is sometimes used with precoating of a GaN thin film of 0.5 µm to 3 µm thickness.

The mask seeds should have a function of inhibiting GaN from growing and sustaining roots of the {11-22} facets. The mask seeds should be made of one of amorphous or polycrystalline silicon oxide ($SiO_2$), silicon nitride (SiN), alumina ($Al_2O_3$), aluminum nitride (AlN), zirconium oxide ($ZrO_2$), yttrium oxide ($Y_2O_3$) and magnesium oxide (MgO) (claim 16).

The growth-inhibiting seed mask takes arbitrary repetition of an elementary shape. The present invention takes six fold symmetry seed patterns laying dot seeds on all corners of two-dimensional repetitions of equilateral triangles. The side of the triangle is a pitch p of the pattern.

The mask seeds should have a diameter w of 5 µm to 100 µm and a pitch p of 100 µm to 500 µm. An optimum range of diameter w is 20 to 50 µm. An optimum range of pitch p is 300 µm to 500 µm.

A preferable example is a GaAs (111) undersubstrate, an $SiO_2$ seed mask of a 20-50 µm diameter and a 300-500 µm pitch.

At an early stage of growth, protrusions originate from the {11-22} facets in the accompanying low dislocation single crystal regions (Z). The protrusions have reverse-orientation. FIG. 13 shows the change of the orientations at a {11-22} facet in a pit. Positive fourth Miller indices mean downward-faced planes. Negative fourth Miller indices mean upward-faced planes. Bottoms of the protrusions are {11-22} planes.

Tops of the protrusions are {11-2-m} (m=3, 4, 5, 6, 7, 8, 9) (hexagon) or {11-2-m} (m=3, 4, 5, 6, 7, 8, 9) and {1-10-n} (n=2, 3, 4 . . . ) (dodecagon). In many cases, the tops are {11-2-6}, {11-2-5}, {1-10-4} and {1-10-3} facets. The protrusions centripetally extend (FIG. 12). The protrusions collide and unify with each other. The unified protrusions form shallow cones following the steeper {11-22} facet cones.

The closed defect accumulating regions (H) epitaxially grow on the unified protrusions. Then, the top surfaces of the closed defect accumulating regions (H) are {11-2-m} (m=3, 4, 5, 6, 7, 8, 9) (hexagon) or {11-2-m} (m=3, 4, 5, 6, 7, 8, 9) and {1-10-n} (n=2, 3, 4 . . . ) (dodecagon).

BRIEF DESCRIPTION OF THE DRAWINGS

FIG. 1(a) is a partial perspective view of a facet pit occurring on a GaN surface in the facet growth proposed by previous Japanese Patent Laying Open No. 2001-102307 for showing that facets growing inward sweep dislocations to crossing lines, the rising crossing lines convey inward the dislocations and dislocations are converged at the bottom of the pit.

FIG. 1(b) is a partial perspective view of a facet pit on the GaN surface after continual facet growth proposed by previous Japanese Patent Laying Open No. 2001-102307 for showing that strong repulsion among the dislocations releases dislocations and forms hexagonal symmetric radial planar defects dangling from the pit.

FIG. 3(1) is a sectional view of a facet pit occurring on a GaN surface in the facet growth proposed by previous Japanese Patent Laying Open No. 2001-102307 for showing that facets grow in inward directions different from an average growing direction (c-axis), the inward growing facets sweep dislocations to crossing lines, the rising crossing lines carry the dislocations inward in parallel with a C-plane, the converged dislocations form a bundle of dislocations at a multiple point at the pit bottom.

FIG. 3(2) is a sectional view of a facet pit occurring on a GaN surface in the facet growth proposed by previous Japanese Patent Laying Open No. 2001-102307 for showing that the bottom dislocation bundles are not closed and the once converged dislocations diffuse outward from the pit bottom by repulsion acting among dislocations during the growth.

FIG. 4(1) is a sectional view of a facet pit occurring on a GaN surface in the facet growth proposed by the present invention for showing that facets grow in inward directions different from an average growing direction (c-axis), the inward growing facets sweep dislocations to crossing lines, the rising crossing lines carry the dislocations inward in parallel with a C-plane, the facet pit makes a closed defect accumulating region (H) at the bottom and the converged dislocations are accumulated in the closed defect accumulating region (H).

FIG. 4(2) is a sectional view of a facet pit occurring on a GaN surface after the facet growth proposed by the present invention for showing that dislocations once accumulated in the closed defect accumulating region (H) do not escape from the closed defect accumulating region (H).

FIG. 14 shows an ELO mask and a facet-seed mask of the present invention.

DETAILED DESCRIPTION OF THE PREFERRED EMBODIMENTS

Embodiment 1

Figure 2:
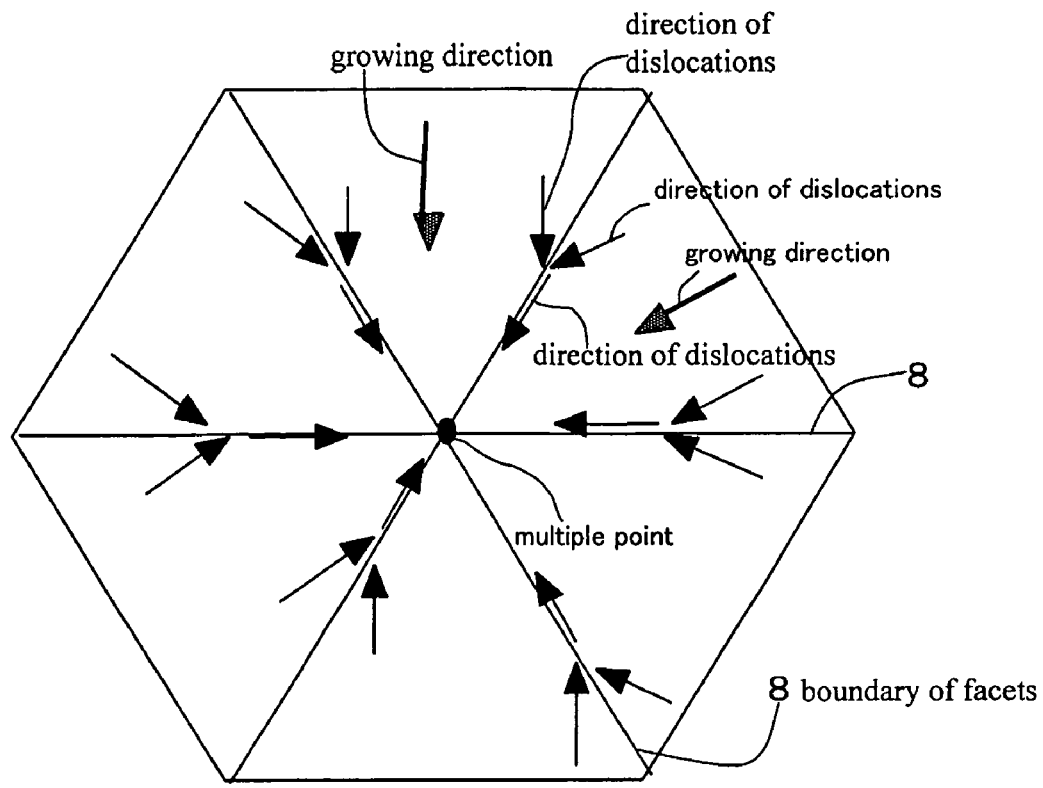
FIG. 2 is a plan view of a facet pit occurring on a GaN surface in the facet growth proposed by previous Japanese Patent Laying Open No. 2001-102307 for showing that facets grow in inward directions (B) different from an average growing direction (c-axis), the inward growing facets sweep dislocations to crossing lines and a multiple point D at the pit bottom accumulates high density dislocations.
Figure 5:
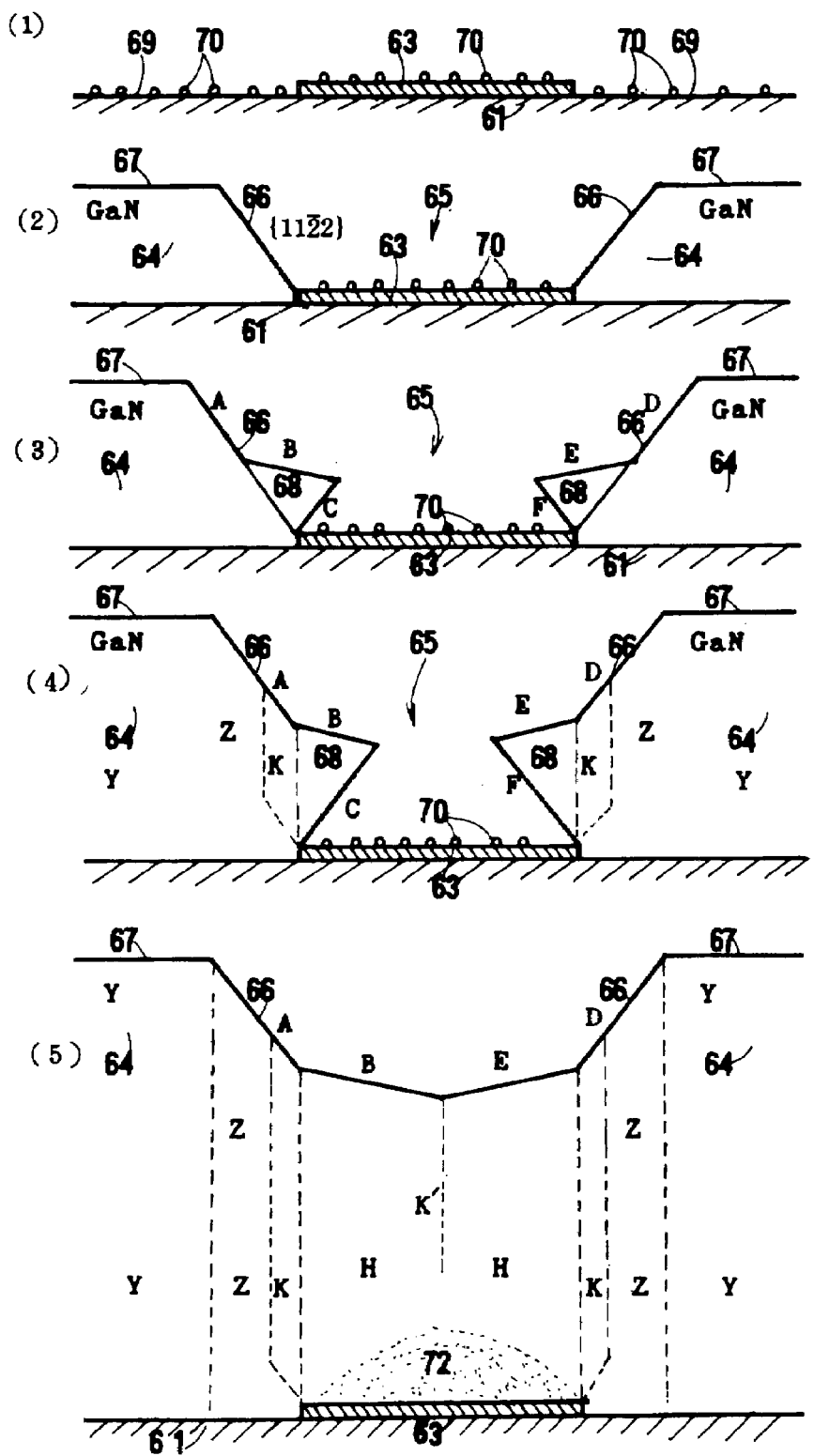
FIG. 5 shows a series of sectional figures showing a method of growing a GaN single crystal of the present invention by implanting a seed on an undersubstrate (FIG. 5(1)), growing a GaN crystal blanket on a non-seeded part of the undersubstrate on the condition of facet growth, making reverse-conical pits composed of slanting facets (FIG. 5(2)), making orientation-inverse single crystal protrusions on the slanting facets (FIG. 5(3)), prolonging tips of the protrusions extending from the facets above the seed (FIG. 5(4)), and unifying the protrusions, making an orientation-inverse single crystal closed defect accumulating regions (H) on the unified protrusions, making accompanying low dislocation single crystal regions (Z) as parts of the GaN blanket around the seeds, and producing an extra low dislocation single crystal region (Y) as another parts of the GaN blanket (FIG. 5(5)).
Figure 6:
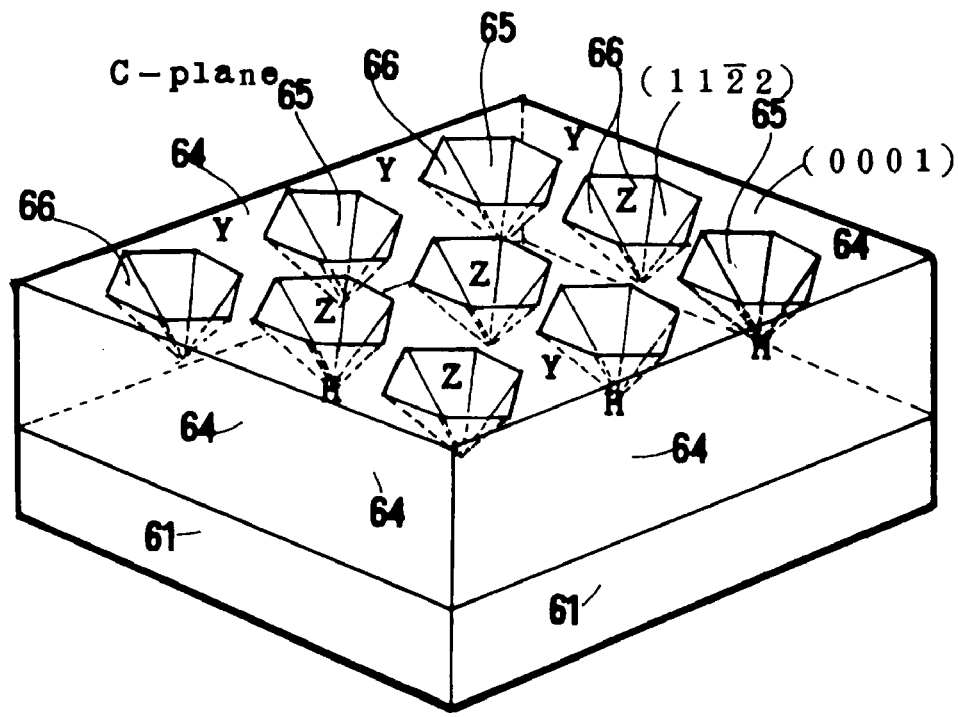
FIG. 6 is a perspective view of a part of a GaN/undersubstrate made by the seed-facet method of the present invention.

1. Growth of GaN Layers on Undersubstrates

[1. Preparation of Undersubstrates]

A plurality of three kinds of undersubstrate S1, S2, S3 are prepared. All the three kinds of undersubstrate have circular wafers of a 51 mm (2 inches) diameter.

S1. (0001) sapphire ($Al_2O_3$) wafer (top surface is a C-plane)
S2. (111) GaAs wafer (top surface is a Ga-surface; A-plane)
S3. (0001) GaN/sapphire wafer (1.5 μm GaN+sapphire) which has been made by coating a 51 mmϕ sapphire wafer on which a 1.51 μm-thick GaN film has been grown by an MOCVD method.

[2. Formation of Dotted Seeding Mask]

Silicon oxide ($SiO_2$) films of a 0.1 μm thickness are deposited by a plasma CVD method on the three kinds of the undersubstrates. The mask consists of dotted round seeds regularly populated on the undersubstrate.

The mask seeds are made by photolithography, which has steps of coating the $SiO_2$/undersubstrates with a resist, exposing the resist via four different stripe patterned photomasks, etching away the exposed parts. Four different seed masks B1, B2, B3, B4 having an assembly of <1-100>-direction aligning seeds, in which neighboring sets are off-set by a half period, are obtained. Dotted seeds lie on all the corners of repeated identical equilateral triangles imagined to be laid on the undersubstrate without gaps. The sets of dotted seeds have six-fold rotation symmetry. The seeds have a definite width w and a definite pitch p (spatial period). Here, the pitch p is the length of a side of the virtual equilateral triangles.

B1; seed diameter w=5 μm, pitch p=300 μm.
B2; seed diameter w=20 μm, pitch p=300 μm.
B3; seed diameter w=50 μm, pitch p=300 μm.
B4; seed diameter w=200 μm, pitch p=500 μm.

[3. Formation of Buffer Layers]

GaN films are made upon the dot seeded undersubstrates B1, B2, B3 and B4 by an HVPE (hydride vapor phase epitaxy) method which produces GaCl by reaction of HCl gas with over 800° C. melted Ga ($2HCl+Ga \rightarrow 2GaCl+H_2$) in a Ga-boat, guides GaCl downward, and synthesizes GaN by another reaction of GaCl with ammonia gas ($GaCl+NH_3 \rightarrow GaN+HCl+H_2$) and deposits a GaN film on the seed-masked undersubstrate. Carrier gases of HCl and $NH_3$ are hydrogen $H_2$ gas. HVPE growths are carried out twice. The first HVPE growth is a low temperature growth of making a thin buffer layer. Second HVPE growth is a high temperature growth of making a thick epitaxial layer. The carrier gas for carrying HCl and $NH_3$ is hydrogen gas ($H_2$).

(Condition of a Low Temperature Buffer Layer Deposition)

| | |
|---|---|
| Undersubstrates(12 kinds) | S1, S2, S3 × B1, B2, B3, B4 |
| Temperature | 490° C. |
| HCl partial pressure | 0.002 atm (0.266 Pa) |
| $NH_3$ partial pressure | 0.2 atm (26.6 Pa) |
| Growth time | 15 minutes |
| GaN film thickness | 60 nm (buffer layer) |

The first HVPE produces 60 nm buffer layers. Epitaxial layers are further grown upon the buffer layers at a high temperature.

[4. Formation of Epitaxial Layers]

(Condition of High Temperature Epitaxial Layer Deposition)

| | |
|---|---|
| Undersubstrates (12 kinds) | S1, S2, S3 × B1, B2, B3, B4 × buffer |
| Temperature | 1010° C. |
| HCl partial pressure | 0.02 atm (2.66 Pa) |
| $NH_3$ partial pressure | 0.25 atm (33 Pa) |
| Growth time | 15 min, 30 min, 60 min, 600 min |

The specimens are taken out of the furnace, and are examined and estimated of various properties. The 600 min-grown specimens are ground and polished to smooth, flat circular wafers.

(1) Observation of Crystal Growth of Embodiment 1

Samples (S2*B3) which have (111) GaAs undersubstrates (S2) with a 50 μm/300 μm seed-mask (B3) are examined by an optical microscope and a scanning electron microscope (SEM).

15 minute grown samples (S2*B3), which have been taken out of the furnace after 15 minute growth, have a thick GaN epitaxial blanket on non-seeded parts but no GaN films upon the mask seeds. There are few isolated fine polycrystals on the mask seeds. The thickness of the GaN blanket on the non-seeded parts is about 25 μm. The GaN blanket consists of a flat, wide continual top plateau and regularly distributing pits on the mask seeds. Each of the pits has a bottom and a cone (hexagon or dodecagon). The bottoms are still naked seeds having small, isolated polycrystalline GaN grains. The cone comprises {11-22} facets or {11-22} & {1-101} facets. Roots of the facets are in contact with the edges of the seeds. The flat top plateau of the GaN blanket is a (0001) plane (C-plane).

30 minute grown samples (S2*B3), which have been taken out of the furnace after 30 minute growth, have a thicker GaN epitaxial blanket only on the non-seeded parts. The thickness of the GaN blanket has been increased up to 50 μm. But, the seeded parts have not continual film yet but a little few tiny isolated polycrystalline grains. Growth of the crystalline GaN is rigorously stopped by conical facetted walls rooted to the edges of the mask seeds in the pits. The slanting cone walls of the pits are {11-22} facets.

Plenty of rugged protrusions, which slantingly and centripetally extend toward centers of vacant spaces above the mask seeds, appear on the side {11-22} facets in the pits. The protrusions are rooted on the {11-22} facets of the pits. Upper surfaces of the extending protrusions incline at angles of 25 degrees to 35 degrees to a horizontal plane. Lower surfaces of the extending protrusions are not in contact with the seeds but are separated from the seeds. The lower surfaces incline at 55 degrees o 65 degrees to a horizontal plane. The appearance of the centripetal protrusions rooted on the facets of the pits is a new discovery. The protrusions give a basis of a new contrivance of the present invention.

60 minute grown samples (S2*B3), which have been taken out of the furnace after 60 minute growth, have an about 100 μm thick GaN epitaxial grown blanket on the non-seeded parts and pits on the seeds. The pits are hexagonal or dodecagonal cones with slanting walls of {11-22} facets or {11-22} and {1-102} facets rooted on the edges of the seeds. The centripetal protrusions further grow inward from the conical facets.

Several protrusions extending from the cone facets meet with each other above the centers of the mask seeds and bridge over the seeds. Centripetal protrusions are unified at the tips above the seeds. Unification of the protrusions proceeds in allover the conical pits. Wide rugged bridges are formed over the seeds.

Upper surfaces of the unified protrusions incline at angles of 25 degrees to 35 degrees to the horizontal lines and form mild reverse-cones of bottom obtuse angles of 130 degrees to 110 degrees. The slanting angles (25-35 degrees) of the on-seed upper surfaces are smaller than the oblique angle of the preceding {11-22} facets. The on-seed upper surfaces turn out to be {11-2-m}(m≧3) facets or {11-2-m}(m≧3) and {1-10-n}(n≧2) facets. Double inclining reverse cones are produced by the preceding {11-22} facets and the succeeding {11-2-m}(m≧3) protrusions. Lower surfaces of the protrusions are separated from the mask. The lower surfaces turn out to be {11-22} planes, which are the same index as the facing facets. There are still small vacant spaces between the unified protrusions and the seeds.

600 minute grown samples (S2*B3), which have been taken out of the furnace after 600 minute growth, have about a 1000 μm (=1 mm) thick GaN blanket on the non-seeded parts and regularly aligning pits on the seeds. The structure of the double conical pits, which has appeared on the seeds in the 60 min samples, is maintained. The pit has an upper, steeper {11-22} facet cone and a lower milder {11-2-m} (m≧3) facet cone. The flat plateau is a (0001) plane (C-plane). The double conical pits grow upward for 10 hours, maintaining the inherent shape of the 60 minute grown double conical pits.

In any case, no crack appears in the GaN blanket on the non-seeded parts. The 600 minute grown samples have a rugged top surface with many pits having the double facets.

The bottom GaAs undersubstrates of the 600 minute grown GaN/GaAs samples are eliminated by grinding. Rugged GaN substrates are obtained. The top surfaces are also ground into flat surfaces. The top and bottom surfaces are further polished into smooth surfaces. Smooth, flat freestanding GaN substrate wafers of a 50 mm diameter are obtained. Optical microscope observation confirmed that there is no crack allover on the GaN wafer.

(2) Estimation of Crystal Properties

Crystal properties of the 600 min facet-grown & polished GaN samples are estimated by various methods.

First, the 600 min grown polished GaN wafers are examined by a transmission electron microscope (TEM), an electron beam diffraction method and a convergent beam electron diffraction(CBED) method. Clear diffraction patterns denote that the GaN wafers are single crystals.

There is no difference in electron beam diffraction patterns between the on-seed grown shallow conical parts and the GaN blanket on the non-seeded parts. This means that the on-seed grown parts have the same single crystal structure as the GaN blanket grown on the non-seed parts. But, the electron beam diffraction cannot discern inversion of crystal orientations.

Second, the 600 min grown freestanding GaN wafers are examined by a Convergent Beam Electron Diffraction (CBED). The CBED method clarifies that the on-seed grown parts have a C-axis which is 180-degree inversion of the C-axis of the blanket grown on the non-masked parts. The on-mask grown (shallow cones) parts seem to be inverse-orientation regions having -C-axis in the direction of the C-axis of the blanket (normal-orientation).

The on-non-seed grown GaN blanket has a Ga-surface (0001) on the top. The on-seed grown (shallow cones) parts have an N-surface (000-1) on the top.

The on-seed grown shallow conical parts are (000-1) single crystals and the on-non-seed grown blanket is a (0001) single crystals.

The TEM and the CBED teach us that the rugged protrusions rooted on the steeper cone {11-22} facets are inherently inverse-orientation crystals, the shallow cones initiated by and piled on the unified protrusions are also inverse-orientation crystals and all the on-seed grown parts are inverse-orientation (000-1) crystals having 180 degree inverted C-axes. The other GaN blanket is a normal C-plane surface (0001) crystal. A novel growth mechanism clarifies that developments of the inverse-orientation protrusions make inverse-orientation crystals allover on the seeds.

Estimation of the facet-grown GaN crystals is further done by a cathode luminescence (CL) method and fluorescence microscope observation.

The freestanding polished GaN wafers are substrates in which most of the top surface (blanket) is a (0001) C-plane and narrow on-seed tops are -C-plane (000-1). The polished GaN wafers are flat and transparent. The cathode luminescence method which selects about 360 nm as a measuring wavelength can clarify histories of growth by differences of contrast of luminescence. The orientation inversion parts are observed in an CL image as dark contrast parts.

The normal orientation parts have bright contrast in the CL picture. We observe that dark contrast spots appear with six fold symmetry on the corners of two-dimensionally repeating equilateral triangles of a 300 μm side. The CL result confirms that the on-seed grown parts are orientation-inverse parts and the wide GaN blanket is a normal-orientation (upward C-plane) part. The interfaces between the orientation-inversion parts and the normal-orientation blanket are observed as clear dark lines. This means that the interfaces are grain boundaries (K).

30 & 60 min grown GaN/GaAs specimens are examined. The rugged protrusions appearing at 30 minute growth have an upper surface and a lower surface which root on side facets {11-22}. Upper surfaces should have {11-2-m} (m≧3) and lower surfaces should have {11-2n}(n≧2) in general from the directional restriction. The upper surface inclines at 25 degrees to 35 degrees to a horizontal plane. The upper surfaces of the protrusions are considered to be {11-2-6} or {11-2-5}. The lower surfaces incline at 55 degrees to 65 degrees to a horizontal plane. The lower surfaces of the protrusions are considered to be {11-22} plane.

The lower {11-22} surfaces have the same index as the facing {11-22} facets. The lower {11-22} surfaces of the protrusions are perfectly antiparallel to the counterpart facing facet {11-21}. Thus the orientation of the protrusion can be re-established by turning a part of the facing facet around a horizontal axis at 180 degrees. Then, the protrusions are originally, inherently orientation-inverse single crystals.

The orientation-inverted protrusions expand centripetally from 30 minutes to 60 minutes without touching the mask seeds. At 60 minutes, the pairing protrusions encounter, combine above the seed and bridge the seed. The upper unified surfaces {11-2-6} or {11-2-5} make shallow cones having milder slopes than the root {11-22} facets. GaN crystals grow further in the reverse-orientation upon the shallow cones. Then, all the GaN crystals above the seeds become an orientation-inverse GaN single crystal. Vacant spaces just on the seeds are filled with GaN inverse crystal grains after the unification.

Dislocation density in the GaN specimens is examined by the cathode luminescence method. Threading dislocations appear as black points in a CL picture. The dislocation density can be obtained by counting the number of black dots in an object area and dividing the number by the area. The dislocation density is measured locally on the polished specimens. It turns out that the on-non-seed grown parts (Z, Y) have very low dislocation density of $10^4$ cm$^{-2}$ to $10^5$ cm$^{-2}$ and dislocations are surprisingly reduced in the on-non-seed grown parts (Z, Y). On the contrary, the on-seed grown parts (H) have high dislocation density of $10^6$ cm$^{-2}$ to $10^9$ cm$^{-2}$.

It has been well known that a GaN thin film grown on a sapphire substrate has dislocation density of $10^8$ cm$^{-2}$ to $10^9$ cm$^{-2}$. The seed-facet growth of the present invention succeeds in reducing dislocations by a factor of $10^{-3}$ to $10^{-4}$. Then, the inventors name the on-seed grown ($10^6$ cm$^{-2}$-$10^9$ cm$^{-2}$) parts closed defect accumulating regions (H). The on-non-seed facet-grown ($10^4$ cm$^{-2}$-$10^5$ cm$^{-2}$) single crystal parts are named low dislocation single crystal regions (Z). The continual on-non-seed C-plane grown ($10^4$ cm$^{-2}$-$10^5$ cm$^{-2}$) parts are named extra low dislocation single crystal (C-plane growth) region (Y).

(3) Influences Induced by Different Seed Mask Patterns (B1, B2, B3, B4)

B1; w=5 μm, p=300 μm.
B2; w=201 μm, p=300 μm.
B3; w=50 μm, p=300 μm.
B4; w=200 μm, p=500 μm.

The above described matters relate to examples of the specimens (S2*B3) having B3 (diameter w=50 μm) seed masks on GaAs. Similar experiments are done on GaAs undersubstrates having different B1 (diameter w=5 μm), B2(diameter w=20 μm), B4(diameter w=200 μm) seed masks. Similar results are obtained for the specimens with different types of seed masks.

In the case of the seed mask B1, the seeds are too narrow. The narrow seeds make narrow H regions. The narrow H regions obscure existence of grain boundaries within the orientation-inverse (H) regions. The narrow seeds allow the closed defect accumulating regions (H) to disappear accidentally. The B1 masked specimens, which are not the best example, can obtain an similar effect of reducing dislocations in the Z and Y regions. B2 (w=20 μm) seeded specimens are nearly identical to the described B3 masked specimens. The B2, B3 seed mask specimens are best.

B4 seed masked specimens, which have 200 μmφ wide seeds, exhibit a drawback. Protrusions rooted on the facets should extend by 100 μm till the protrusions meet and couple at the center of the seeds. It takes too long time to unify centripetally extending protrusions. Such wide seeds delay growth. The wide seeds widen the closed defect accumulating regions (H) which are of no use of making laser diodes. Too wide closed defect accumulating regions (H) raise the cost. Thus, desirable diameters of the seeds are 5 μm to 100 μm.

(4) Influences by Different Kinds of Undersubstrates

S1; sapphire undersubstrate
S2; GaAs undersubstrate
S3; 1.5 μm GaN/sapphire undersubstrate The above description relates to the specimens (S2*B3) with a GaAs undersubstrate (S2). Similar experiments are done on S1 (sapphire) and S3 (1.5 μm GaN coated sapphire) undersubstrates. Results on S1 and S3 are identical to S2.

In the S1 case, sapphire single crystal (0001) wafers of 51 mm φ are prepared. An $SiO_2$ film of a 0.1 μm thickness is produced on the sapphire undersubstrates by a plasma CVD method. B1, B2, B3 and B4 seed masks are formed by photolithography upon the sapphire 51 mmφ undersubstrate. GaN buffer thin layers are grown at a low temperature below 700° C. GaN epitaxial layers are grown on the seeded sapphire wafer at a high temperature over 1000° C. Similarly to the S2 (GaAs) case, a thick GaN crystal blanket grows on a non-seeded part of the undersubstrate. The blankets have many reverse conical pits which have bottoms of the seeds.

Slanting sides of the pits are {11-22} facets. The {11-22} facets prevent the GaN blanket crystal from invading upon the seeds till the GaN blanket reaches a definite height. Protrusions appear on the tall conical facets {11-22} of the pits. The protrusions have inverse-orientation. The protrusions centripetally extend from the facets and couple with each other. Orientation-inverse crystals begin to epitaxially grow on the coupled protrusions. The orientation-inverse single crystals form shallow cones following the {11-22} facets.

Delay of the shallow conical (on-seed grown, orientation-inverse) parts attracts dislocations from the on-non-seed grown GaN blanket. The on-seed shallow cones accommodate the attracted dislocations. Many closed defect accumulating regions (H) of inverse-orientations are produced on the mask seeds.

Accompanying low dislocation single crystal regions (Z) are produced on the non-seeded undersubstrate around the closed defect accumulating region (H). Extra low dislocation single crystal (C-plane growth) regions (Y) appear in the GaN blanket except the Z regions on the non-seeded undersubstrate. The accompanying low dislocation single crystal regions (Z) have low dislocation density of $10^4$ $cm^{-2}$ to $10^5$ $cm^{-2}$. The extra low dislocation single crystal regions (C-plane growth) (Y) have low dislocation density of $10^4$ $cm^{-2}$ to $10^5$ $cm^{-2}$. The closed defect accumulating regions (H) have high dislocation density of $10^6$ $cm^{-2}$ to $10^9$ $cm^{-2}$.

In the S3 case, sapphire single crystal (0001) wafers of 51 mm φ are prepared. A 1.5 μm thick GaN film is deposited on the sapphire undersubstrate by an MOCVD method. An $SiO_2$ film of a 0.1 μm thickness is produced on the GaN/sapphire undersubstrates by a plasma CVD. B1, B2, B3 and B4 seed masks are formed by photolithography upon the GaN/sapphire undersubstrate. GaN buffer thin layers are grown at a low temperature below 700° C. GaN epitaxial layers are grown on the masked GaN/sapphire wafer at a high temperature over 1000° C. Similarly to the S2 (GaAs) case, a thick GaN blanket with pits grows on the non-seeded part of the undersubstrate and the pits coincide with the seeds. The pits have {11-22} facets. Protrusions of inverse-orientation appear on the facets {11-22} and centripetally extend inward from the facets. The GaN blanket grows with normal-orientation. Orientation-inverse crystals begin to pile on the protrusions, forming shallow cones following the {11-22} facets in the pits. Delay of the shallow cones (on-seed grown) parts sweeps dislocations from the on-non-seed grown GaN blanket and accumulate the dislocations into the on-seed shallow cones. The closed defect accumulating regions (H) are produced on the seeds. The blanket has accompanying low dislocation single crystal regions (Z) around the H regions and extra low dislocation single crystal (C-plane growth) regions (Y) except the Z regions.

The accompanying low dislocation single crystal regions (Z) have low dislocation density of $10^4$ $cm^{-2}$ to $10^5$ $cm^{-2}$. The extra low dislocation single crystal (C-plane growth) regions (Y) have low dislocation density of $10^4$ $cm^{-2}$ to $10^5$ $cm^{-2}$. The closed defect accumulating region (H) have high dislocation density of $10^6$ $cm^{-2}$ to $10^9$ $cm^{-2}$.

(5) Influences of Mask Materials

The above embodiments adopt $SiO_2$ as a seed material. The inventors tried other materials for seed masks. 0.1 μm thick B3 mask (w=50 μm, p=300 μm) patterns of $Si_3N_4$, $Al_2O_3$, AlN, $ZrO_2$, $Y_2O_3$ and MgO are formed on sapphire undersubstrates. Low temperature growth and high temperature growth are done on the variously seeded sapphire undersubstrates on the same condition as Embodiment 1. It is confirmed that protrusions appear on the facets of conical pits on a GaN crystal blanket after 30 min epitaxial growth for all the specimens. The above all mask materials are available for the present invention.

[Comparisons of H, Z, Y Regions in Optical, Electrical, Mechanical, Physical Properties]

The GaN substrates made by the present invention are not homogeneous but inhomogeneous. Inhomogeneous GaN substrates may reveal, inhomogeneous, anisotropic, anomalous properties. The GaN substrates are composed of three different regions H, Z and Y. Dotted closed defect accumulating regions (H) are populated regularly on the wafer. The accompanying low dislocation single crystal regions (Z)

accompany the closed defect accumulating regions (H) around. Other continual blanket is the extra low dislocation single crystal region (Y).

Properties of the individual H, Y and Z regions should be examined. The followings are electrical, optical, mechanical, thermal properties of the inhomogeneous GaN substrates made by the present invention.

(1) Absorption Coefficients (λ=300 nm~2000 nm; $\alpha_H$, $\alpha_Z$, $\alpha_Y$)

Absorption for wavelengths 300 nm to 2000 nm is measured for clarifying the difference of the three regions H, Z and Y. A light source produces an examination light beam of a diameter 0.1 mmφ with wavelengths from 350 nm to 650 nm. The thickness d of a GaN substrate sample is 0.4 mm. Power of incident light power Pi, passing light power Pt and reflected light power Pf are measured. An absorption coefficient α is defined as $$\alpha = \log\{Pi/(Pi-Pt-Pf)\}/d.$$

$\alpha_H$, $\alpha_Z$, $\alpha_Y$ are absorption coefficients for the closed defect accumulating region (H), the accompanying low dislocation single crystal region (Z) and the extra low dislocation single crystal region (Y).

TABLE 1

Absorption coefficients [cm$^{-1}$]

| | 350 nm band | 450 nm band | 550 nm band | 650 nm band |
|---|---|---|---|---|
| $\alpha_H$ | 1000-10000 | 1-10 | 1-10 | 1-10 |
| $\alpha_Z$ | 1000-10000 | 1-10 | 1-10 | 1-10 |
| $\alpha_Y$ | 1000-10000 | 10-100 | 1-10 | 1-10 |
| $\alpha_Y/\alpha_H$ | 0.5-2 | 5-20 | 0.5-2 | 0.5-2 |
| $\alpha_Y/\alpha_Z$ | 0.5-2 | 5-20 | 0.5-2 | 0.5-2 |

The absorption coefficient for ultraviolet light 350 nm is more than 1000 cm$^{-1}$ and less than 10000 cm$^{-1}$ in all the three regions H, Z and Y. The large absorption derives from bandgap transition absorption. For visible light wavelengths of green 550 nm and red 650 nm, the absorption coefficient α is more than 1 cm$^{-1}$ and less than 10 cm$^{-1}$.

Absorption is anomalous for 450 nm blue light. The extra low dislocation single crystal region (Y) ($\alpha_Y$=10-100 cm$^{-1}$) absorbs 450 nm blue light about ten times as much as H or Z ($\alpha_H$, $\alpha_Z$=1-10 cm$^{-1}$). Namely, $\alpha_Y/\alpha_H$=5 to 20. The large absorption of 450 nm blue is due to large carbon inclusion in the C-plane-growth extra low dislocation single crystal region (Y).

The closed defect accumulating region (H) and accompanying low dislocation single crystal region (Z) absorb carbon little. But the extra low dislocation single crystal region (Y) absorbs carbon much in the epitaxial growth.

(2) Etching Speed

An etchant is prepared by mixing phosphoric acid ($H_3PO_4$) with sulfuric acid ($H_2SO_4$) at a ratio of $H_3PO_4$:$H_2SO_4$=1:1. Sample GaN wafers are etched by the $H_3PO_4$:$H_2SO_4$=1:1 etchant at 270° C. for 10 minutes. The etching speed of the closed defect accumulating region (H) is higher than 10 μm/h. The etching speed of the extra low dislocation single crystal region (Y) is less than 0.1 μm/h. The etching speed of the accompanying low dislocation single crystal region (Z) is less than 0.1 μm/h.

The closed defect accumulating region (H) is an easy-etching region. The extra low dislocation single crystal (C-plane growth) region (Y) and accompanying low dislocation single crystal region (Z) are etching-difficult regions. Etching ratio of H to Z and Y is more than 100.

TABLE 2

Etching speed

| Region | Closed defect accumulating region (H) | Accompanying low dislocation single crystal region (Z) | Extra low dislocation single crystal region (Y) | H/Y or H/Z |
|---|---|---|---|---|
| Etching speed | >10 μm/h | <0.1 μm/h | <0.1 μm/h | >100 |

(3) XRD

XRD is measured for H, Y and Z regions by an apparatus consisting of an X-ray source which emits X-rays of Cu-Kα1 line, two crystals of germanium (220) and a mirror. The incident X rays shoot GaN wafer samples in a <11-20> orientation. Diffraction planes are (0004) planes. Intensity distribution of beams diffracted by (0004) planes in a <11-20> direction is measured. The FWHM (full width at half maximum) for H is 100 (arcseconds) to 3600 (arcseconds). Here, 60 arcseconds are 1 arcminute. 60 arcminutes are 1 degree. The FWHM for Z and Y is 10 (arcseconds) to 1000 (arcseconds).

TABLE 3

XRD

| Region | Closed defect accumulating region (H) | Accompanying low dislocation single crystal region (Z) | Extra low dislocation single crystal region (Y) | H/Y or H/Z |
|---|---|---|---|---|
| XRD | 100-3600 (arcseconds) | 10-1000 (arcseconds) | 10-1000 (arcseconds) | 3-10 |

The XRD has two kinds of measurements. One of the XRD measurements is an ω-measurement which measures intensity of peaks of diffracted rays. Positions of the peaks are different for H, Y and Z regions in a common sample GaN wafer. Fluctuation of the peak position of the ω-measurement means fluctuation of crystal orientations in H, Y and Z. The FWHM is a width of the diffraction ray peak at a half height. A narrower FWHM means a better order of crystal orientations. The higher FWHM in H means that the crystal orientation in the H region fluctuates more than Y and Z. Another of the XRD measurements is an ω-2θ measurement which teaches us plane distances of an object plane group. In the present case, the diffraction plane is (0004). The plane distance of (0004) is equally 0.5185 nm±0.0001 nm for all the H, Y and Z regions. This signifies that all the H, Y and Z regions are single crystals having the same crystallographical symmetry system.

(4) Electric Resistivity

Figure 7:
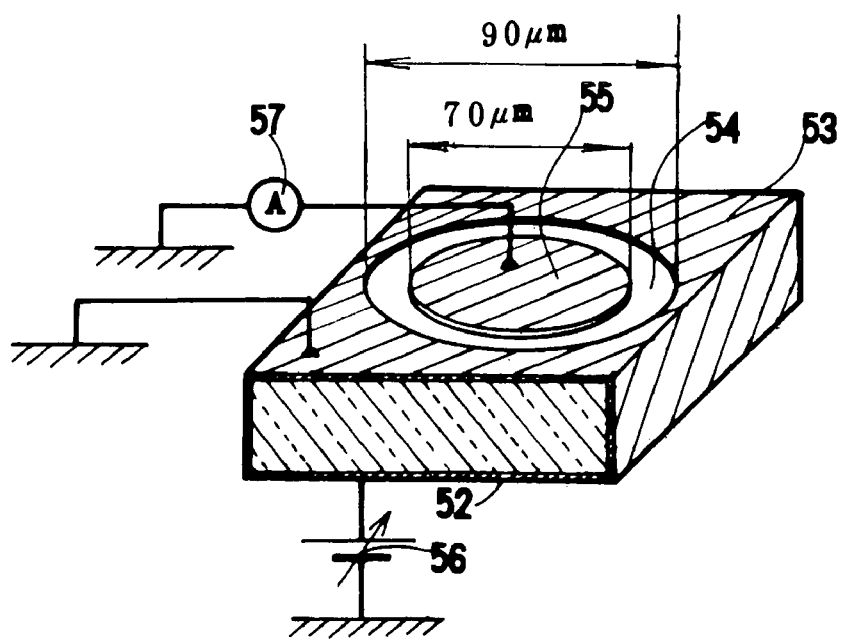
FIG. 7 is an explanatory figure of a three contact method of measuring electric resistance of GaN substrates.

Electric resistances are measured by preparing coating layers on sample GaN wafers as shown in FIG. 7 (a three contact method). A part of the object wafer is shown in the figure. The bottom is coated with a bottom electrode 52. A peripheral part on the top is coated with a guardring electrode 53 with a 90 μm inner diameter for annihilating noise. A central part on an object region is coated with a searching electrode 55 having a 70 μm diameter. A spacing annulus 54 with a 10 μm width of an 80 μm average diameter is interposed between the guardring electrode 53 and the searching electrode 55. The guardring electrode 53 is grounded. The searching electrode 55 is connected via a meter 57 to the ground. The bottom electrode is positively biased by a variable source 56. A resistance R of the object circular region (70 μmφ) is calculated by dividing the voltage V of the source 56 by the current I of the meter 57. Electric resistivity ρ(Ωcm) of the object region is calculated by an equation, $$\rho(\Omega cm) = R(\Omega) \times S(cm^2)/L(cm).$$

Here, S is an area of the object region (70 μmφ) and L(cm) is the thickness of the wafer.

TABLE 4

| | Resistivity | | | |
|---|---|---|---|---|
| Region | Closed defect accumulating region (H) | Accompanying low dislocation single crystal region (Z) | Extra low dislocation single crystal region (Y) | Y/H or Y/Z |
| Resistivity | $10^{-4}$-$10^{-1}$ (Ωcm) | $10^{-4}$-$10^{-1}$ (Ωcm) | $10^{-2}$-$10^{7}$ (Ωcm) | 10-$10^{7}$ |

Anomaly of electric resistivity is different from the previous properties of the absorption, XRD and etching speed in which H is an anomalous region. But, for the electric resistivity, Y is an anomalous region. Y has high resistivity which is 10 to $10^8$ times as large as Z and H. Low resistivity is caused by doping with oxygen (n-type impurity) in Z and H. The C-plane Y region rejects oxygen.

(5) Photoluminescence (PL)

Photoluminescence of the three regions H, Z and Y is examined by a photoluminescence apparatus having an exciting light source of a He—Cd laser for shooting specimens with a 0.1 mmφ beam of 325 nm wavelength ultraviolet rays, spectrometer for selecting wavelengths between 330 nm and 800 nm of photoluminescence, and a power detector for measuring the photoluminescence from the specimens.

Figure 9:
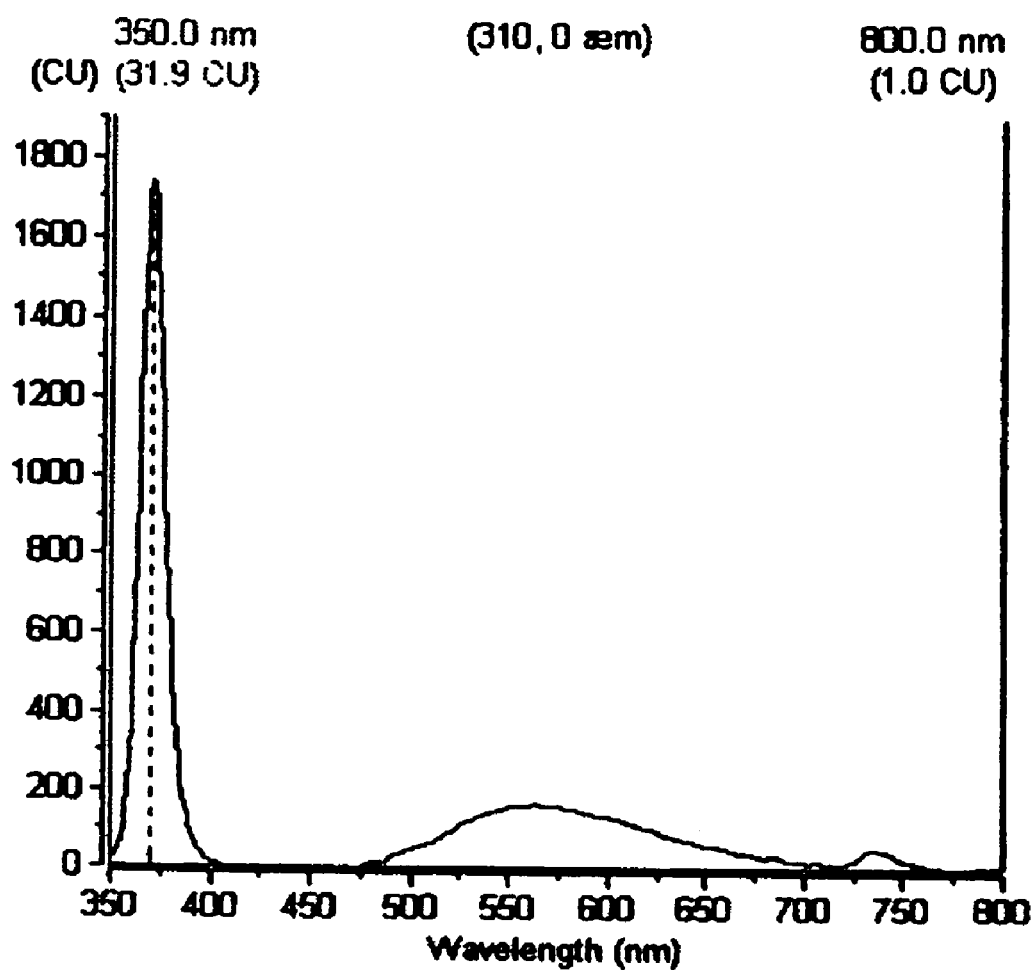
FIG. 9 is a graph of photoluminescence for ultraviolet rays and visible rays of the closed defect accumulating regions (H). An abscissa is an exciting photon wavelength (nm). An ordinate is the photoluminescence intensity (arbitrary unit). H reveals the high 360 nm peak.
Figure 10:
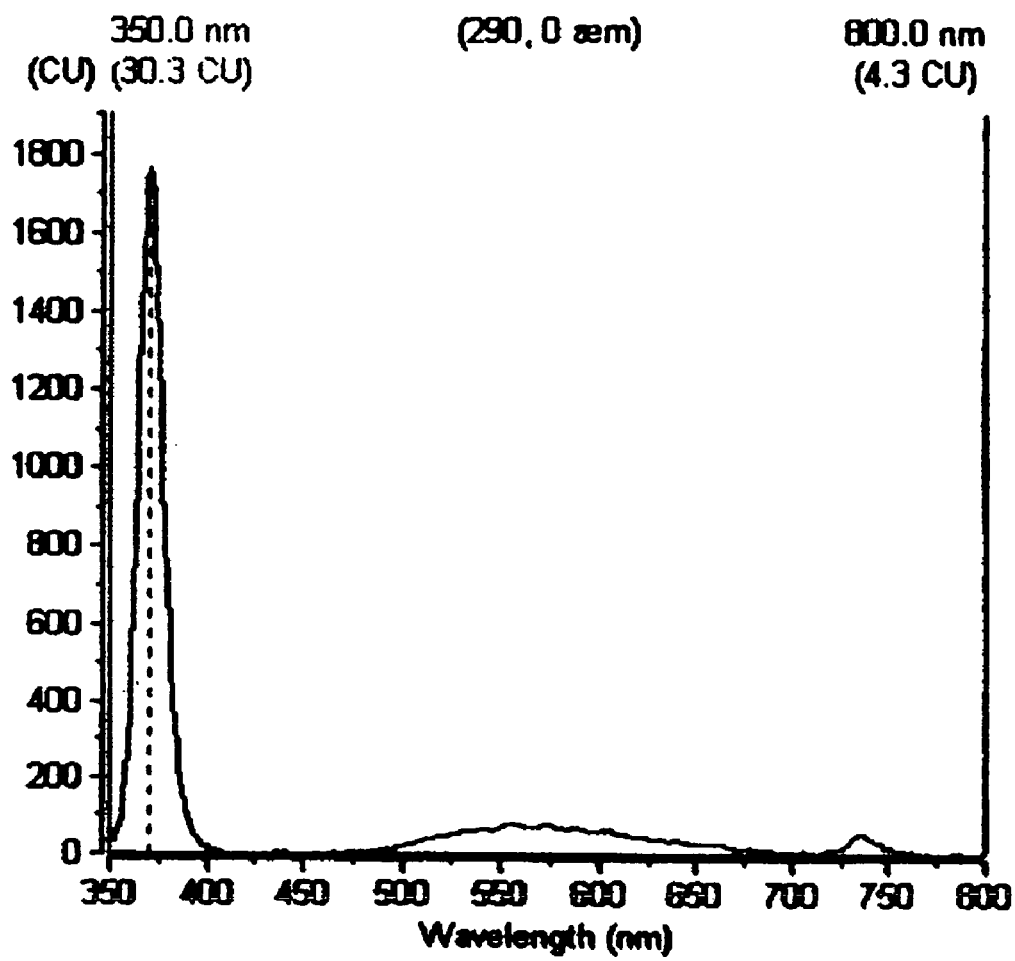
FIG. 10 is a graph of photoluminescence for ultraviolet rays and visible rays of the low dislocation single crystal regions (Z). Z reveals high 360 nm peak.
Figure 11:
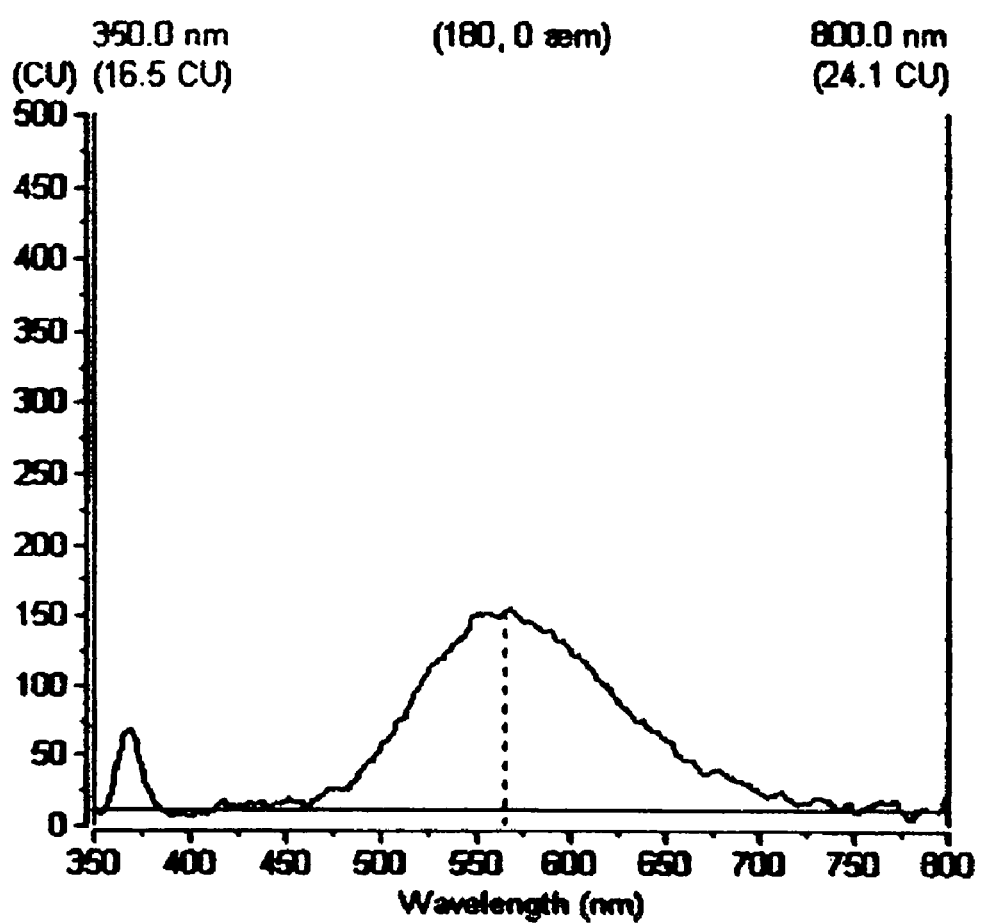
FIG. 11 is a graph of photoluminescence for ultraviolet rays and visible rays of the extra low dislocation (C-plane) single crystal regions (Y). Y reveals a low 360 nm peak and a broad 560 nm peak.
Figure 12:
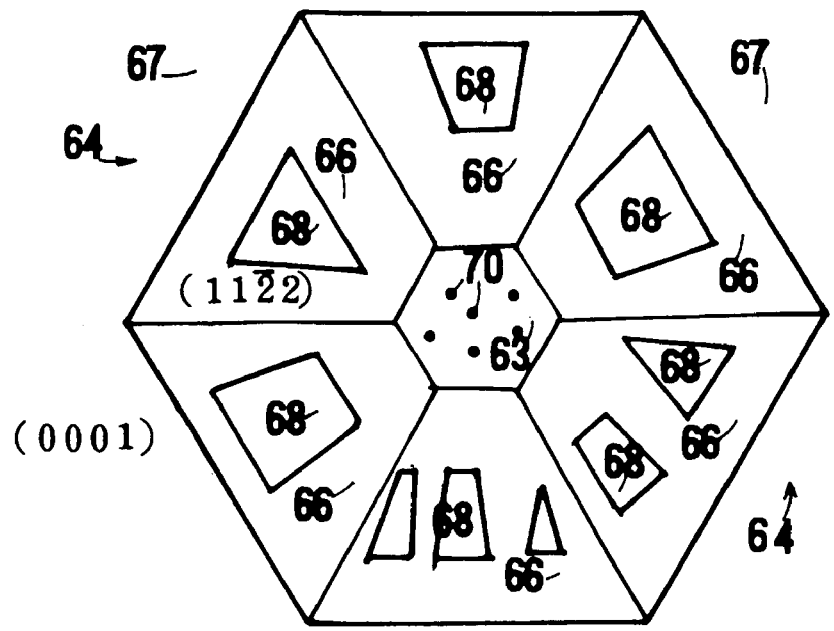
FIG. 12 is a plan view of protrusions rooted on the facets in a pit.
Figure 13:
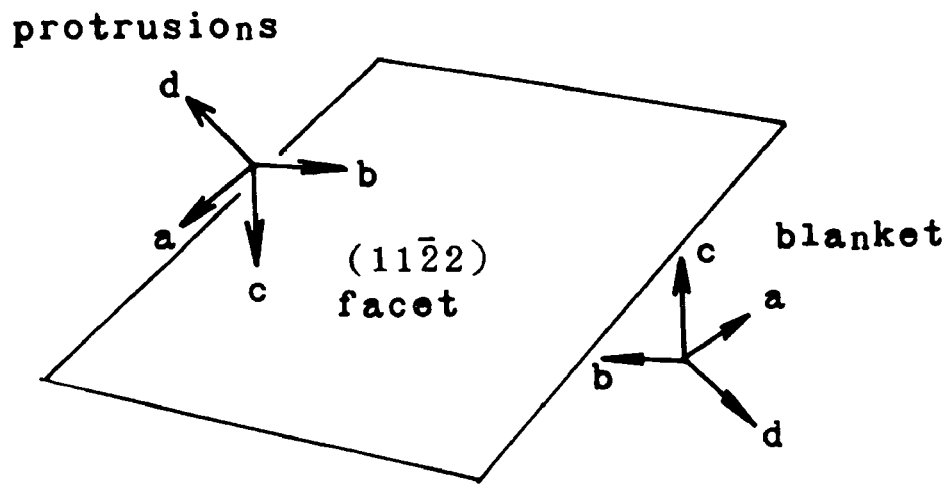
FIG. 13 is an explanatory figure showing a change of orientations at a {11-22} facet in a pit.

Photoluminescence curves for the H, Z and Y regions have a sharp, high peak at ultraviolet 360 nm and a broad, low peak near yellow 560 nm as shown in FIG. 9 (H-region), FIG. 10 (Z-region) and FIG. 11 (Y-region). Absolute values of the photoluminescence strongly vary by changes of incident power of the He—Cd laser, a slit aperture of the spectrometer, and filters. But, ratios of the peak powers of the shorter 360 nm peak and the longer 560 nm peak are stable instead of the changes of the incident power, slit aperture, filters. Then, the ratio of the 360 nm peak to the 560 nm peak is calculated for the three regions H, Z and Y. FIGS. 9, 10 and 11 show the shorter wavelength (360 nm) peak is bigger than the longer wavelength peak (560 nm) for H and Z. The 360/560 ratio is 1730/180=9.6 for H (closed defect accumulating region (H)) in FIG. 9. The 360/560 ratio is 1750/90=19.4 for Z (accompanying low dislocation single crystal region (Z)) in FIG. 10. But, the 360/560 ratio is 70/160=0.44 for Y (extra low dislocation single crystal region (Y)) in FIG. 11.

In the case of photoluminescence, the Y region is anomalous, because the Y region has the stronger 560 nm peak and the weaker 360 nm peak. The H and Z show a common tendency having a stronger 360 nm peak and a weaker 560 nm peak. In the results in FIGS. 9-11, the ratio H/Y is 21.8 and the ratio Z/Y is 44. In general, the 360/560 ratios are 1-1000 for H and Z. The 360/560 ratios are 0.01-10 for Y. The ratio of H/Y or Z/H is ten to hundred times.

TABLE 5

| PL: 360 nm/560 nm PL peak ratio (He—Cd: 325 nm) | | | | |
|---|---|---|---|---|
| Region | Closed defect accumulating region (H) | Accompanying low dislocation single crystal region (Z) | Extra low dislocation single crystal region (Y) | Y/H or Y/Z |
| 360 nm/560 nm PL peak ratio | 1-1000 | 1-1000 | 0.01-10 | 10-$10^5$ |

The absorption at 360 nm corresponds the bandgap transition of GaN. The sharp high 360 nm peaks appearing in the H and Z regions (FIGS. 9 and 10) signify high purity of H and Z. The wide, high 560 nm absorption peak in the Y region (FIG. 11) means that Y includes rich carbon.

The result means that the facet growth has a function of excluding carbon atoms and maintaining purity of growing GaN crystals.

Conventional C-plane growth (extra low dislocation region (Y)) is subject to carbon contamination. High carbon-resistance is another advantage of the facet-growth on which the present invention relies.

(6) Distortion

Distortion, which is not a localized property inherent in the Y, Z, H regions, is a non-local property, which can be defined by a distortion height or a distortion curvature radius. Distortion curvature radii of the GaN wafers made by the present invention are 600 mm at least. Better GaN wafers have good flatness where the distortion curvature radius is longer than 1500 mm. Curvature radii of all the freestanding GaN wafers of the present invention range from 1000 mm to 50000 mm. In practice, heights of centers are measured by pushing the centers by an adjustable needle. The wafer size is 50 mmφ, which uniquely relates curvature radius to the distortion height. A <1-100> direction shows less than about 50 mm of distortion height. A <11-20> direction shows less than about 50 mm of distortion height.

(7) Impurity Concentration

SIMS (secondary ion mass spectrometer) analyzes impurity concentration in each of the H, Z and Y regions of polished GaN sample wafers prepared by the method of the present invention. The SIMS bombards specimens with an accelerated Cs+ ion beam for exiling impurity atoms, bends a recoiled impurity atom beam by a fan-shaped magnet, and measures numbers of atoms bent in various angles. The object area of the SIMS measurement is 50 μmφ. The measuring depth is varied from 0 μm to 5 μm. The H, Z and Y regions contain oxygen(O), silicon (Si) and arsenic (As).

TABLE 6

| | Impurity concentration | | |
|---|---|---|---|
| | O (cm$^{-3}$) | Si (cm$^{-3}$) | As (cm$^{-3}$) |
| H | $10^{16}$-$10^{20}$ | $10^{16}$-$10^{20}$ | $\leq 10^{17}$ |
| Z | $10^{16}$-$10^{20}$ | $10^{16}$-$10^{20}$ | $\leq 10^{17}$ |
| Y | $\leq 10^{18}$ | $10^{16}$-$10^{20}$ | $\leq 10^{17}$ |
| Y/H | $10^{-1}$-$10^{-5}$ | 1 | 1 |
| Y/Z | $10^{-1}$-$10^{-5}$ | 1 | 1 |

(8) Wafer Size

Wafers produced by the method of the present invention have the following ranges of sizes.

Rectangular wafers; 10 mm≦sides≦160 mm
Round wafers; 10 mm≦diameter≦160 mm
Thickness; 5 μm≦thickness≦2000 μm Preferred Embodiment Round Wafer
Diameter; 50 mmφ,
Thickness; 400 μm Rectangular wafers have an advantage of facilitating the identification of resonator mirror planes in fabricating laser diodes. One of the sides of the rectangular wafers coincides with the resonator mirror planes.

Circular wafers, which have rotation symmetry, exhibit an advantage of enabling material gases to make uniform streams and to synthesize uniform epitaxial films without epitaxy anomalies. Smaller wafers having a size less than 10 mm induce random gas flows and incur epitaxy anomalies at wafer edges. Large wafers bigger than a 160 mm diameter invite large distortion heights. The present invention takes, for example, gallium arsenide (GaAs) wafers as undersubstrates. The maximum size of the GaAs wafer sold on the market is 150 mmφ (six inches) at present.

Figure 8:
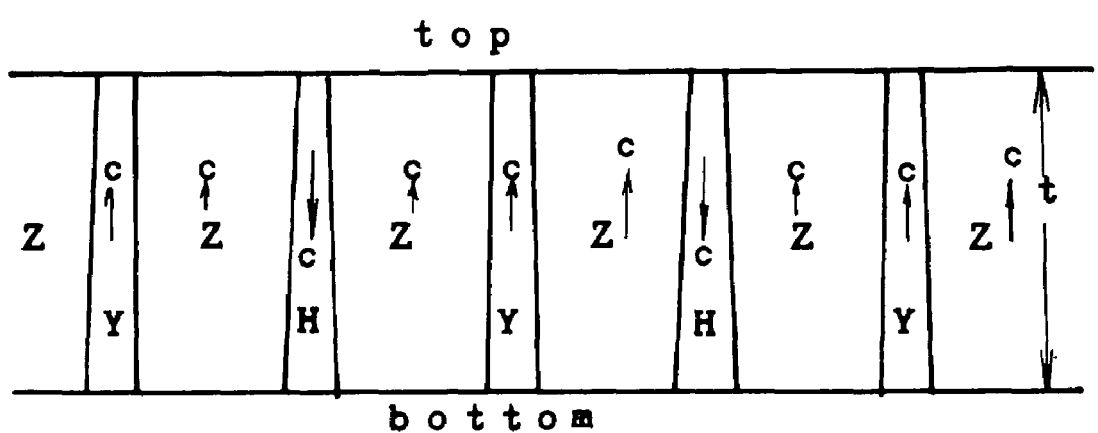
FIG. 8 is a sectional view of a GaN substrate made by the facet-seed method and ground at the top, in which the closed defect accumulating regions (H) and the extra low dislocation single crystal region (Y) diminish but the accompanying low dislocation single crystal regions (Z) dilate during the growth.

(9) Three Dimensional Structure (FIG. 8)

Widths of the H, Y and Z regions vary in the progress of crystal growth. H and Y diminish during the epitaxial growth. Namely, the widths of the H and Y regions on the top are narrower than the widths of H and Y on the bottom. The width of H increases during the growth. FIG. 8 shows the changes of thicknesses of the H, Z and Y regions. The decrease of the H width is 0.001×t to 0.1×t, where t is the thickness of the object GaN wafer. The coefficients vary from 0.001 to 0.1 by the conditions of epitaxial growth.

TABLE 7

Width change of H, Z and Y

| Region | Closed defect accumulating region (H) | Accompanying low dislocation single crystal region (Z) | Extra low dislocation single crystal region (Y) | Rate to thickness |
|---|---|---|---|---|
| Width change | Decrease | Increase | Decrease | $10^{-1}$-$10^{-3}$ |

(10) Dislocation Density

Since GaN is transparent, an optical microscope cannot observe dislocations on GaN wafers. Dislocations are observed by TEM (Transmission Electron Microscope) and CL (Cathode Luminescence). The TEM, which has a 10 μm×10 μm vision, takes ten sequential fields of vision beginning from an arbitrary point extending in the <11-20> direction as object points and scans the ten fields of vision in the <11-20> direction. Cathode luminescence can discern H, Y, Z and dislocations. Dislocation density is obtained by counting the number of dislocations in a definite area and dividing the number by the area.

EXAMPLE 1 (TEM OBSERVATION)

A GaN wafer made by the method of the present invention shows dislocation distribution on H, Z and Y as follows.
H; $1\times10^7$ cm$^{-2}$-$2\times10^7$ cm$^{-2}$
Z; $1\times10^5$ cm$^{-2}$-$1\times10^7$ cm$^{-2}$
Y; $2\times10^4$ cm$^{-2}$-$2\times10^5$ cm$^{-2}$

EXAMPLE 2 (TEM OBSERVATION)

Another GaN wafer made by the method of the present invention shows dislocation distribution on H, Z and Y as follows.
H; $5\times10^7$ cm$^{-2}$-$1\times10^8$ cm$^{-2}$
Z; $3\times10^5$ cm$^{-2}$-$3\times10^7$ cm$^{-2}$
Y; $2\times10^5$ cm$^{-2}$-$1\times10^6$ cm$^{-2}$ Dislocation density fluctuates even in the same regions of H, Z and Y in a sample. In general, H has the highest density.

The closed defect accumulating region (H) is anomalous regarding dislocation density. H has dislocations more than Y and Z (H>Y, H>Z). In the H region, the dislocation density is $5\times10^6$ cm$^{-2}$ to $5\times10^8$ cm$^{-2}$. More than 50% of the Z region has low dislocations less than $5\times10^6$ cm$^{-2}$. More than 60% of the Y region has low dislocations less than $5\times10^6$ cm$^{-2}$. General tendency is H>Z>Y in dislocations.

TABLE 8

| | Dislocation density | | | |
|---|---|---|---|---|
| Region | Closed defect accumulating region (H) | Accompanying low dislocation single crystal region (Z) | Extra low dislocation single crystal region (Y) | Z/H or Y/H |
| Dislocation density | $5\times10^6$-$5\times10^8$ (cm$^{-2}$) | <$5\times10^6$ (cm$^{-2}$) (more than 50%) | <$5\times10^6$ (cm$^{-2}$) (more than 60%) | $10^{-3}$-$10^{-1}$ |

(11) Thermal Conductivity

Thermal conductivity Q (W/ms) is measured on GaN samples (15 mm×15 mm×0.8 mm) prepared by cutting a planar crystal of 15 mm×15 mm from the GaN wafer made by the present invention and polishing both surfaces into a 0.8 mm thickness. Heat diffusion rate D (m$^2$/s) of the samples is measured by a laser flash method. Specific heat C (kJ/kgK) is measured by a DSC method. Specific gravity ρ(kg/m$^3$) is measured by an Archimedes method. Thermal conductivity is obtained by the equation, $$Q(\text{W/ms}) = \rho(\text{kg/m}^3) \times C(\text{kJ/kgK}) \times D(\text{m}^2/\text{s}).$$

TABLE 9

| | Thermal conductivity | | | | |
|---|---|---|---|---|---|
| Thermal conductivity | Example 3 | Example 4 | Example 5 | Example 6 | Example 7 |
| Q (W/mK) | 170 | 191 | 205 | 195 | 182 |

The thermal conductivity of the GaN wafers made by the present invention ranges from 150 W/mK to 220 W/mK.

(12) Vickers Hardness

Vickers hardness is measured on the H, Z and Y regions by pushing down a diamond rectangular cone on object positions (H, Z and Y) with an application load P(kgf), measuring a diagonal length "a" of a pit made by the cone, and calculating Vickers hardness Hv by an equation, $$Hv=1.8544 \times P/a^2.$$

Here, the application load is 50 kgf to 200 kgf.

TABLE 10

Vickers hardness

| Vickers hardness Hv | Example 3 | Example 4 | Example 5 | Example 6 | Example 7 |
|---|---|---|---|---|---|
| H | 1270 | 1340 | 1310 | 1380 | 1480 |
| Z | 1260 | 1710 | 1510 | 1450 | 1520 |
| Y | 1340 | 1740 | 1550 | 1530 | 1580 |

Vickers hardness turns out to be anomalous for H, Z and Y. The closed defect accumulating region (H) has the lowest Hv. Since H includes many defects, H is the softest among three regions. The extra low dislocation single crystal region (Y) is the highest Hv. Since Y is the most perfect regularity, the extra low dislocation single crystal region (Y) is the hardest among three. The Vickers hardness is 1200-1500 Hv for H, 1200-1800 Hv for Z and 1300-1800 Hv for Y.

(13) Flaw Density

Surfaces of GaN crystal wafers have flaws as defects in addition to the dislocations. Flaw density is defined by the number of flaws crossed by an arbitrarily drawn 1 mm long line. A differential interference microscope can discern flaws randomly dispersing on the surfaces of GaN wafers.

The wafers are photographed by the differential interfence microscope with a field of vision of 300 μm×400 μm at a magnifying ratio of 40 times. The flaw density is obtained by drawing a definite length examination line on the photograph, counting the number of the flaws crossing the examination line, and dividing the crossing flaw number by an actual examination line length (mm).

TABLE 11

Flaw density

| Flaw density (lines/mm) | Example 3 | Example 4 | Example 5 | Example 6 | Example 7 |
|---|---|---|---|---|---|
| H | $8 \times 10^4$ | 2 | $1 \times 10^3$ | $1.1 \times 10^3$ | 12 |
| Z | $2.4 \times 10^4$ | 1 | $9.8 \times 10^2$ | $1 \times 10^3$ | 18 |
| Y | $9.3 \times 10^4$ | 3 | $8.3 \times 10^2$ | $1.2 \times 10^3$ | 15 |

The flaw density has no anomaly depending upon H, Z and Y. The flaw density is less than $1 \times 10^5$ lines/mm for all H, Z and Y.

(14) Crystal Growth Speed

The same sapphire substrate as Embodiment 1 is used as an undersubstrate. The dotted mask pattern B3 is formed on the undersubstrate and a GaN buffer layer is formed in the same conditions as Embodiment 1. Then, the temperature is raised to 1000° C., an epitaxial layer is grown on the buffer layer for 60 minutes in various conditions of the following Table 12, and the growth states of the closed defect accumulating regions (H) grown on seeds are confirmed.

TABLE 12

Crystal growth conditions

| | Condition 1 | Condition 2 | Condition 3 | Condition 4 | Condition 5 |
|---|---|---|---|---|---|
| NH₃ partial pressure (atm) | 0.15 | 0.2 | 0.2 | 0.25 | 0.25 |
| HCl partial pressure (atm) | 0.003 | 0.006 | 0.01 | 0.02 | 0.03 |
| Growth speed (μm/h) | 11 | 30 | 53 | 100 | 155 |

The results of the growth are such confirmed that the growth of the closed defect accumulating regions (H) is insufficient and some areas without the closed defect accumulating region (H) are found under the conditions 1 and 5, but the growth of (H) is successful under the conditions 2, 3 and 4. Consequently, the growth speed of the conditions 2, 3 and 4 is preferable. Namely, the crystal growth speed of the GaN crystals of the present invention is preferably between 30 μm/h and 100 μm/h.

We claim:

1. A method of growing a GaN crystal comprising the steps of:
   preparing an undersubstrate;
   forming a dotted mask pattern made of a material inhibiting GaN from growing partially on the undersubstrate;
   providing the undersubstrate with a seed mask with a plurality of regularly aligning isolated, dotted seeds made of a material inhibiting GaN from growing;
   forming seeded parts which are parts of the undersubstrate covered with the seed mask and a non-seeded part which is a part of the undersubstrate not covered with the seed mask;
   epitaxially growing the GaN crystal on the non-seeded part of the undersubstrate but not growing the GaN crystal on the seeded parts of the undersubstrate at the beginning of GaN growth;
   forming a plurality of reverse-conical pits having facets slantingly extending from edges of the seeded parts to the non-seeded part;
   forming protrusions of GaN crystals which have reversed orientation different from that of the GaN crystal on the non-seeded part by 180 degrees and project slantingly from the slanting facets;
   extending the protrusions so as not to touch the seeds;
   unifying the protrusions near an upper middle of the seeded parts;
   covering the whole seeded parts with the protrusions;
   increasing a thickness of the GaN crystal on the non-seeded part with growing of the protrusions above the seeded parts;
   increasing a thickness of the GaN crystal as a whole; and
   obtaining the GaN crystal having normal-oriented regions formed on the non-seeded part and the reverse-oriented regions formed on the seeded parts.

2. The method according to claim 1, wherein the GaN crystal is grown at a first low temperature between 400° C. and 600° C., and then, reverse-conical pits having facets are formed and the protrusions of GaN are formed from the facets while the GaN crystal is epitaxially grown at a second temperature between 900° C. and 1100° C.

3. The method according to claim 1, wherein GaN fine polycrystalline granules are heaped on the seeded parts during an early stage of growth at a first low temperature.

4. The method according to claim 1, wherein a crystal growth speed is 30 μm/h to 100 μm/h when the protrusions having the reversed orientation cover the whole seeded parts.

5. A method of producing a single crystal GaN substrate comprising the steps of:
preparing an undersubstrate;
providing the undersubstrate with a seed mask with a plurality of regularly aligning isolated, dotted seeds made of a material inhibiting GaN from growing;
forming seeded parts which are parts of the undersubstrate covered with the seed mask and a non-seeded part which is a part of the undersubstrate not covered with the seed mask;
epitaxially growing GaN crystals on the non-seeded part of the undersubstrate but not growing a GaN crystal on the seeded parts of the undersubstrate at a beginning of GaN growth;
forming the GaN crystal with normal orientation (0001) defined by an upward c-axis on the non-seeded part of the undersubstrate;
forming a plurality of reverse-conical pits having facets slantingly extending from edges of the seeded parts to the non-seeded part;
making a plurality of reverse-oriented (000-1) protrusions which have a downward c-axis, do not touch the seeds at the beginning of GaN growth, and project slantingly from the slanting GaN facets;
unifying the reverse-oriented protrusions extending centripetally from facing facets above centers of the seeds while growing the normal-oriented (0001) GaN crystal with the facets;
piling epitaxially GaN on the unified protrusions;
forming reverse-oriented (000-1) closed defect accumulating regions (H) on the seeds;
forming normal-oriented (0001) accompanying low dislocation single crystal regions (Z) accompanying the facets on the non-seeded part without burying the facets;
forming normal-oriented (0001) extra low dislocation single crystal regions (Y) growing between the adjoining accompanying low dislocation single crystal regions (Z) and (Z) while maintaining a flat C-plane;
forming grain boundaries (K) accompanying orientation reverse between the closed defect accumulating regions (H) and the accompanying low dislocation single crystal regions (Z);
forming lattice misfitting grain boundaries (K') generated by lattice misfit in unification of the protrusions;
increasing thicknesses of the regions (Z)(Y)(H) by epitaxial growth without burying the facets;
obtaining a binary substrate composed of a GaN substrate having a structure (Y(Z(H)Z)Y) of concentric (H)(Z) dots buried in a (Y) pond and the undersubstrate;
eliminating the undersubstrate from the GaN substrate by grinding or etching; and
obtaining a freestanding single crystal GaN substrate having the structure (Y(Z(H)Z)Y) of the concentric (H)(Z) dots buried in the (Y) pond.

6. The method according to claim 5, wherein a thin GaN buffer layer is preliminarily formed on the undersubstrate before forming the seed mask.

7. The method according to claim 5, wherein dislocations of the accompanying low dislocation single crystal regions (Z) and the extra low dislocation single crystal regions (Y) are reduced by growing the facets upward, attracting the dislocations to a manifold point D at the bottom of the facets, accumulating the dislocations in the closed defect accumulating regions (H) and the grain boundaries (K), annihilating a part of the dislocations, and holding the rest of the dislocations in the closed defect accumulating regions (H) and the grain boundaries (K) permanently, and the closed defect accumulating regions (H) serve as an annihilation/accumulation place of the dislocations.

8. The method according to claim 5, further comprising a step of polishing a top surface and a bottom surface of the freestanding GaN substrate.

9. The method according to claim 5, wherein top surfaces of the accompanying low dislocation single crystal regions (Z) and the extra low dislocation single crystal regions (Y) are Ga-planes and top surfaces of the closed defect accumulating regions (H) are N-planes.

10. The method according to claim 5, wherein top surfaces of the growing extra low dislocation single crystal regions (Y) are (0001) planes, top surfaces of the growing accompanying low dislocation single crystal regions (Z) are reverse cones having {11-22} facets or {1-101} facets and top surfaces of the growing closed defect accumulating regions (H) are shallow cones with milder slanting facets.

11. The method according to claim 10, wherein the milder slanting facets on the closed defect accumulating regions (H) incline at 25 degrees to 35 degrees to a horizontal plane.

12. The method according to claim 10, wherein the milder slanting facets on the closed defect accumulating regions (H) are {11-2-6} facets, {11-2-5} facets or other facets inclining at a small angle to {11-2-6} or {11-2-5} facets.

13. The method according to claim 5, wherein the protrusions appearing on the pit facets have upper surfaces of {11-2-6}, {11-2-5} facets or other facets inclining at a small angle to the {11-2-6}, {11-2-5} facet and lower surfaces of {11-22} facets having a larger inclination angle to a horizontal plane.

14. The method according to claim 5, wherein the closed defect accumulating regions (H) have continual grain boundaries (K') induced by unifying the protrusions at centers, and the grain boundaries (K') annihilate a part of the dislocations and hold the rest of the dislocations permanently.

15. The method according to claim 5, wherein top surfaces of the growing extra low dislocation single crystal regions (Y) are (0001) planes, top surfaces of the growing accompanying low dislocation single crystal regions (Z) are {11-22} planes, top surfaces of the growing orientation-inverse closed defect accumulating regions (H) are {11-2-m} planes (m=3, 4, 5, 6, 7, 8, 9 . . . ) and bottoms of the protrusions projecting from the facets are {11-22} planes.

16. The method according to claim 5, wherein top surfaces of the extra low dislocation single crystal regions (Y) are (0001) planes, top surfaces of the accompanying low dislocation single crystal regions (Z) are {11-22} and {1-101} facets, top surfaces of the closed defect accumulating regions (H) are {11-2-m} (m=3, 4, 5, 6, 7, 8, 9 . . . ) and {1-10-n} (n=2, 3, 4, 5 . . . ) planes and bottoms of the protrusions projecting from the facets are {11-22} and {1-101} facets.

17. The method according to claim 5, wherein the seeds have a pitch of 100 μm to 1000 μm.

18. The method according to claim 5, wherein the seeds have a diameter of 5 μm to 100 μm.

19. The method according to claim 5, wherein the GaN crystal is grown at a first low temperature between 400° C. and 600° C., and then, reverse-conical pits having facets are formed and the protrusions of GaN are formed from the facets while the GaN crystal is epitaxially grown at a second temperature between 900° C. and 1100° C.

20. The method according to claim 5, wherein GaN fine polycrystalline granules are heaped on the seeded parts during an early stage of growth at a first low temperature.

21. The method according to claim 5, wherein a plurality of fine GaN polycrystalline granules made by low temperature growth at an early step of the growth prevent GaN crystals having the same orientation as the facets from extending horizontally from a facet lower part to the seeded part and have functions of separating the reverse-oriented protrusions from the seeds and extending the protrusions from the facets.

22. The method according to claim 5, wherein a crystal growth speed is 30 μm/h to 100 μm/h when the protrusions having the reversed orientation cover the whole seeded parts.

23. The method according to claim 5, wherein the seed mask for inhibiting GaN epitaxial growth is made of one of amorphous or polycrystalline silicon oxide ($SiO_2$), silicon nitride (SiN), alumina ($Al_2O_3$), aluminum nitride (AlN), zirconium oxide ($ZrO_2$), yttrium oxide ($Y_2O_3$) and magnesium oxide (MgO).

24. The method according to claim 5, wherein the under-substrate is one of a sapphire ($Al_2O_3$) single crystal, a silicon (Si) single crystal, a silicon carbide (SiC) single crystal, a magnesium oxide (MgO) single crystal, a zinc oxide (ZnO) single crystal, a gallium arsenide (GaAs) single crystal, an indium phosphide (InP) single crystal, a gallium phosphide (GaP) single crystal, a gallium nitride (GaN) single crystal and an aluminum nitride (AlN) single crystal.

25. A single crystal GaN substrate comprising:
a plurality of closed defect accumulating regions (H) which are positioned in predetermined plural places, have a predetermined size, and have reversed orientation (000-1);
accompanying low dislocation single crystal regions (Z) which adjoin the closed defect accumulating regions (H), have a predetermined size, and have normal orientation (0001);
extra low dislocation single crystal regions (Y) which are sandwiched between the next plural accompanying low dislocation single crystal regions (Z) and (Z) and have normal orientation (0001);
grain boundaries (K) which are generated by orientation reverse on the boundaries between the closed defect accumulating regions (H) and the accompanying low dislocation single crystal regions (Z); and
grain boundaries (K') which are made of lattice misfit lines in the closed defect accumulating regions (H),
wherein a lot of dislocations are caught and held in the grain boundaries (K)(K') and a structure (Y(Z(H)Z)Y) of concentric (H)(Z) dots buried in a (Y) pond is composed of the regions (H)(Z)(Y).

26. The single crystal GaN substrate according to claim 25, wherein discrepancy of the orientations of the neighboring regions at the lattice misfit lines is less than 5 degrees.

27. The single crystal GaN substrate according to claim 25, wherein absorption coefficients for a 350 nm wavelength range from 1000 $cm^{-1}$ to 10000 $cm^{-1}$ in the closed defect accumulating regions (H), the accompanying low dislocation single crystal regions (Z), and the extra low dislocation single crystal regions (Y), absorption coefficients for 550 nm and 650 nm wavelengths range from 1 $cm^{-1}$ to 10 $cm^{-1}$ in the closed defect accumulating regions (H), the accompanying low dislocation single crystal regions (Z), and the extra low dislocation single crystal regions (Y), absorption coefficients for a 450 nm wavelength range from 1 $cm^{-1}$ to 10 $cm^{-1}$ in the closed defect accumulating regions (H) and the accompanying low dislocation single crystal regions (Z) but range from 10 $cm^{-1}$ to 100 $cm^{-1}$ in the extra low dislocation single crystal regions (Y), and a ratio of Y/H or Y/Z of the absorption coefficients for the 450 nm wavelength is 5 to 20.

28. The single crystal GaN substrate according to claim 25, wherein etching speeds for an etchant $H_3PO_4$: $H_2SO_4$=1:1 at 270° C., are more than 10 μm/h for the closed defect accumulating regions (H) but less than 0.1 μm/h for the extra low dislocation single crystal regions (Y) and the accompanying low dislocation single crystal regions (Z), and a ratio H/Z or H/Y of the etching speed is more than 100.

29. The single crystal GaN substrate according to claim 25, wherein FWHM (full width at half maximum) of diffracted X-rays for incidence X-rays of Cu-Kα1 line shooting in a <11-20> direction and being diffracted by (0004) planes is 100 arcseconds to 3600 arcseconds for the closed defect accumulating regions (H), 10 arcseconds to 1000 arcseconds for the accompanying low dislocation single crystal regions (Z) and the extra low dislocation single crystal regions (Y) and a ratio H/Z or H/Y of the FWHM is 3 to 10.

30. The single crystal GaN substrate according to claim 25, wherein electric resistivity is $10^{-4}$ Ωcm to $10^{-1}$ Ωcm in the closed defect accumulating regions (H) and the accompanying low dislocation single crystal regions (Z) but $10^{-2}$ Ωcm to $10^7$ Ωcm in the extra low dislocation single crystal regions (Y) and a ratio Y/Z or Y/H of the electric resistivity is 10 to $10^7$.

31. The single crystal GaN substrate according to claim 25, wherein a ratio of photoluminescence intensity of 360 nm to photoluminescence intensity of 560 nm is 1 to 1000 times for the closed defect accumulating regions (H) and the accompanying low dislocation single crystal regions (Z) but the ratio is 0.01 to 10 times for the extra low dislocation single crystal regions (Y) and a ratio Y/H or Y/Z of the photoluminescence ratios is 10 to $10^5$ times.

32. The single crystal GaN substrate according to claim 25, wherein distortion curvature radius is 600 mm to 50000 mm.

33. The single crystal GaN substrate according to claim 25, wherein oxygen concentration is less than $10^{18}$ $cm^{-3}$ in the extra low dislocation single crystal regions (Y) but is $10^{16}$ $cm^{-3}$ to $10^{20}$ $cm^{-3}$ in the closed defect accumulating regions (H) and the accompanying low dislocation single crystal regions (Z) and a ratio of Y/H or Y/Z of the oxygen concentration is $10^{-5}$ to $10^{-1}$.

34. The single crystal GaN substrate according to claim 25, wherein the GaN substrate is a rectangular wafer and a side of the rectangle is 10 mm to 160 mm and a thickness of the wafer is 5 μm to 2000 μm.

35. The single crystal GaN substrate according to claim 25, wherein the GaN substrate is a round wafer, a diameter of the wafer is 10 mm to 160 mm and a thickness of the wafer is 5 μm to 2000 μm.

36. The single crystal GaN substrate according to claim 25, wherein widths of the closed defect accumulating regions (H) and the extra low dislocation single crystal regions (Y) on the top are narrower than that on the bottom, but widths of the accompanying low dislocation single crystal regions (Z) on the top are wider than that on the bottom.

37. The single crystal GaN substrate according to claim 36, wherein decreasing ratios of the widths of the closed defect accumulating regions (H) and the extra low dislocation single crystal regions (Y) are 0.000t to 0.1t, where t is a thickness of the GaN substrate.

38. The single crystal GaN substrate according to claim 25, wherein dislocation density of the grain boundaries (K)(K') catching and holding dislocations is $10^6$ cm$^{-2}$ to $10^9$ cm$^{-2}$, dislocation density of the closed defect accumulating regions (H) is $5\times10^6$ cm$^{-2}$ to $5\times10^8$ cm$^{-2}$, dislocation density of more than 50% of the accompanying low dislocation single crystal regions (Z) is less than $5\times10^6$ cm$^{-2}$, dislocation density of more than 60% of the extra low dislocation single crystal regions (Y) is less than $5\times10^6$ cm$^{-2}$, a ratio of Z/H of the dislocation density is $10^{-3}$ to $10^{-1}$, and a ratio of Y/H of the dislocation density is $10^{-3}$ to $10^{-1}$.

39. The single crystal GaN substrate according to claim 25, wherein thermal conductivity is isotropic and 150 W/mK to 220 W/mK in both directions parallel and vertical to the mask-seeds.

40. The single crystal GaN substrate according to claim 25, wherein Vickers hardness is 1200-1600 Hv for the H regions, 1200-1800 Hv for the Z regions and 1300-1800 Hv for the Y region.

41. The single crystal GaN substrate according to claim 25, wherein flaw density is less than $10^5$ lines/mm for all the H, Z and Y regions.

42. The single crystal GaN substrate according to claim 25, wherein the closed defect accumulating regions (H) are a plurality of isolated regions having a size of 5 μm to 100 μm and are regularly positioned at a pitch of 100 μm to 1000 μm, the accompanying low dislocation single crystal regions (Z) are a plurality of regions surrounding the isolated regions (H), and the extra low dislocation single crystal regions (Y) are a continuous region touching all of the accompanying low dislocation single crystal regions (Z).

* * * * *